United States Patent
Takahashi et al.

(10) Patent No.: US 12,003,236 B2
(45) Date of Patent: Jun. 4, 2024

(54) SEMICONDUCTOR DEVICE

(71) Applicant: Kioxia Corporation, Tokyo (JP)

(72) Inventors: Ryuji Takahashi, Ota Tokyo (JP);
Kazuya Matsuzawa, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 47 days.

(21) Appl. No.: 17/688,482

(22) Filed: Mar. 7, 2022

(65) Prior Publication Data
US 2023/0080416 A1 Mar. 16, 2023

(30) Foreign Application Priority Data

Sep. 14, 2021 (JP) ................................ 2021-149530

(51) Int. Cl.
*H03K 19/003* (2006.01)
*H03K 19/0185* (2006.01)

(52) U.S. Cl.
CPC ............... *H03K 19/00338* (2013.01); *H03K 19/018521* (2013.01)

(58) Field of Classification Search
CPC ............ H03K 19/003; H03K 19/0033; H03K 19/00338; H03K 19/0175; H03K 19/0185; H03K 19/018521; H01L 23/552; H01L 2027/11894
See application file for complete search history.

(56) References Cited

U.S. PATENT DOCUMENTS

| | | | | |
|---|---|---|---|---|
| 5,103,277 A | * | 4/1992 | Caviglia | H01L 27/1203 257/349 |
| 5,311,051 A | | 5/1994 | Tukizi | |
| 6,094,068 A | * | 7/2000 | Nomura | H01L 27/092 326/15 |
| 6,278,287 B1 | * | 8/2001 | Baze | H01L 21/761 365/72 |
| 6,326,809 B1 | * | 12/2001 | Gambles | G11C 11/4125 326/46 |

(Continued)

OTHER PUBLICATIONS

Welch et al., "Experimental and Simulated Cycling of ISFET Electric Fields for Drift Reset," IEEE Electron Device Letters, vol. 34, No. 3, 2013, 456-458.

(Continued)

*Primary Examiner* — Jason M Crawford
(74) *Attorney, Agent, or Firm* — Foley & Lardner LLP

(57) ABSTRACT

A semiconductor device includes: an electronic circuit to receive a first signal and transmit a second signal; a power supply circuit to supply a power supply voltage to the electronic circuit; and a correction circuit to change a value of the power supply voltage to switch between a normal and a refresh operation mode. The electronic circuit includes: a first Pch transistor in which a potential of a first gate changes according to the first signal, and a potential of one of the first source and drain changes in response to the power supply voltage; and a first Nch transistor in which the second gate is electrically connected to the first gate, a potential of one of the second source and drain is equal to or lower than a ground potential, and another of the second source and drain is electrically connected to another of the first source and drain.

10 Claims, 18 Drawing Sheets

(56) References Cited

U.S. PATENT DOCUMENTS

| | | | | |
|---|---|---|---|---|
| 6,628,159 | B2* | 9/2003 | Voldman | H01L 29/78615 |
| | | | | 257/E29.281 |
| 6,794,908 | B2* | 9/2004 | Erstad | H01L 29/78615 |
| | | | | 327/112 |
| 7,456,478 | B2* | 11/2008 | Tsutsumi | H01L 27/0928 |
| | | | | 257/350 |
| 7,847,616 | B2* | 12/2010 | Hashimoto | H03K 19/0013 |
| | | | | 327/107 |
| 8,975,952 | B2* | 3/2015 | Fechner | H03K 3/01 |
| | | | | 326/103 |
| 9,748,955 | B1* | 8/2017 | Gasiot | H03K 19/00338 |
| 10,348,302 | B1* | 7/2019 | Ross | H03K 19/0033 |
| 10,833,673 | B2 | 11/2020 | Matsuura et al. | |
| 11,119,522 | B2* | 9/2021 | Huang | G05F 3/205 |
| 2007/0069305 | A1* | 3/2007 | Kuboyama | H03K 19/00338 |
| | | | | 257/369 |
| 2014/0247068 | A1* | 9/2014 | Smith | H03K 19/00346 |
| | | | | 326/12 |
| 2017/0153996 | A1* | 6/2017 | Ross | H04L 12/40032 |
| 2017/0228270 | A1* | 8/2017 | El-Maleh | H03K 19/007 |
| 2019/0244958 | A1* | 8/2019 | Aurola | H01L 21/823807 |
| 2020/0357681 | A1 | 11/2020 | Donnelly | |
| 2021/0021266 | A1* | 1/2021 | Satou | H01L 29/518 |
| 2022/0107345 | A1* | 4/2022 | Nakagawa | H03K 19/00315 |
| 2023/0080416 | A1* | 3/2023 | Takahashi | H03K 19/018521 |
| | | | | 326/9 |

OTHER PUBLICATIONS

Park, et al., "Curing of Aged Gate Dielectric by the Self-Heating Effect in MOSFETs," IEEE Trans. ED, vol. 67, No. 3, 2020, 777-788.

Han, et al., "Monolithically integrated microheater for On-Chip Annealing of Oxide Defects," IEEE Electron Device Letters, vol. 38, No. 7, 2017, 831-834.

* cited by examiner

SEMICONDUCTOR DEVICE

CROSS-REFERENCE TO RELATED APPLICATION

This application is based upon and claims the benefit of priority from Japanese Patent Application No. 2021-149530, filed on Sep. 14, 2021; the entire contents of which are incorporated herein by reference.

FIELD

Embodiments relate to a semiconductor device.

BACKGROUND

In recent years, known examples of a semiconductor device include a semiconductor device having a field-effect transistor (FET).

DETAILED DESCRIPTION

Figure 1:
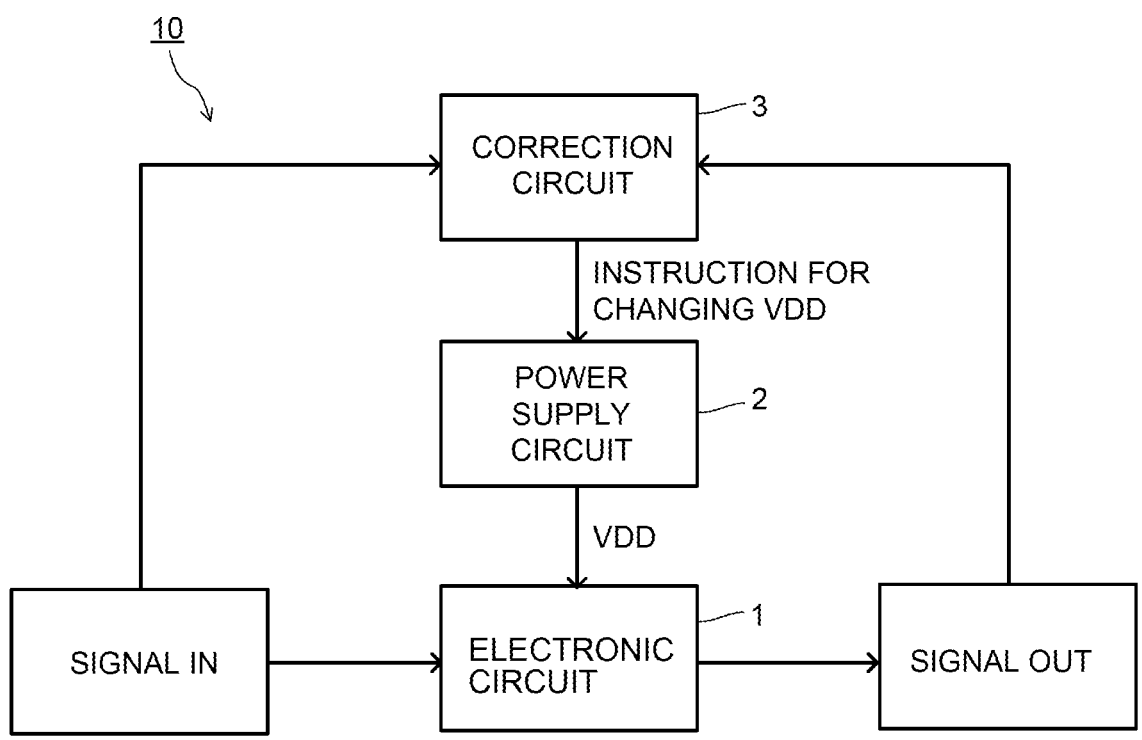
FIG. 1 is a block diagram illustrating a configuration example of a semiconductor device.

A semiconductor device in an embodiment includes: an electronic circuit configured to receive a first signal and transmit a second signal; a power supply circuit configured to supply a power supply voltage to the electronic circuit; and a correction circuit configured to control the power supply circuit to change a value of the power supply voltage to switch between a normal operation mode and a refresh operation mode of the device. The electronic circuit comprises: a first P-channel type field-effect transistor having a first gate, a first source, and a first drain, a potential of the first gate changing in response to the first signal, and a potential of one of the first source and the first drain changing in response to the power supply voltage; and a first N-channel type field-effect transistor having a second gate, a second source, and a second drain, the second gate being electrically connected to the first gate, a potential of one of the second source and the second drain being equal to or lower than a ground potential, and another of the second source and the second drain being electrically connected to another of the first source and the first drain. The refresh operation mode comprises at least one operation selected from the group consisting of: a first operation of applying a negative voltage between the first gate and at least one selected from the group consisting of the first source and the first drain so that the first gate is lower in potential than the at least one selected from the group consisting of the first source and the first drain, and applying a negative voltage between the second gate and at least one selected from the group consisting of the second source and the second drain so that the second gate is lower in potential than the at least one selected from the group consisting of the second source and the second drain; a second operation of applying a positive voltage between the first gate and at least one selected from the group consisting of the first source and the first drain so that the first gate is higher in potential than the at least one selected from the group consisting of the first source and the first drain, and applying a positive voltage between the second gate and at least one selected from the group consisting of the second source and the second drain so that the second gate is higher in potential than the at least one selected from the group consisting of the second source and the second drain; and a third operation of applying a voltage between the first drain and the first source, and applying a voltage between the second drain and the second source.

Embodiments will be hereinafter explained with reference to the drawings. A relation between the thickness and planar dimensions of each component illustrated in the drawings, a thickness ratio among the components, and so on may be different from actual ones. Further, in the embodiments, substantially the same components are denoted by the same reference signs, and an explanation thereof will be omitted when appropriate.

First Embodiment

FIG. 1 is a block diagram illustrating a configuration example of a semiconductor device. A semiconductor device 10 includes an electronic circuit 1, a power supply circuit 2, and a correction circuit 3.

The electronic circuit 1 is a circuit to be controlled. The electronic circuit 1 has a function of receiving a signal IN and transmits a signal OUT. The electronic circuit 1 may have a NOT gate (also referred to as a NOT circuit, an inverter circuit), a NOR gate (also referred to as a NOR circuit), or a NAND gate (also referred to as a NAND circuit). The electronic circuit 1 may have, but not limited to these logic gates, another logic gate.

The power supply circuit 2 has a function of supplying a power supply voltage VDD to the electronic circuit 1. The power supply circuit 2 can change the value of the power supply voltage VDD to be supplied to the electronic circuit 1 in response to a signal from the correction circuit 3. An example of the power supply has a plurality of switches and switches ON/OFF of each of the switches in response to the signal from the correction circuit 3, and thus can change the value of the power supply voltage VDD.

The correction circuit 3 receives the signal IN and the signal OUT. The correction circuit 3 has a function of controlling the power supply circuit 2 referring to the signal IN as needed according to the fluctuation of the signal OUT to change the value of the power supply voltage VDD, thereby switching among a plurality of operation modes of the device 10. An example of the correction circuit 3 transmits a signal to the power supply circuit 2, the signal being for commanding the power supply circuit 2 to change the value of the power supply voltage VDD to be output from the power supply circuit 2.

First Configuration Example of the Electronic Circuit 1

Figure 2:
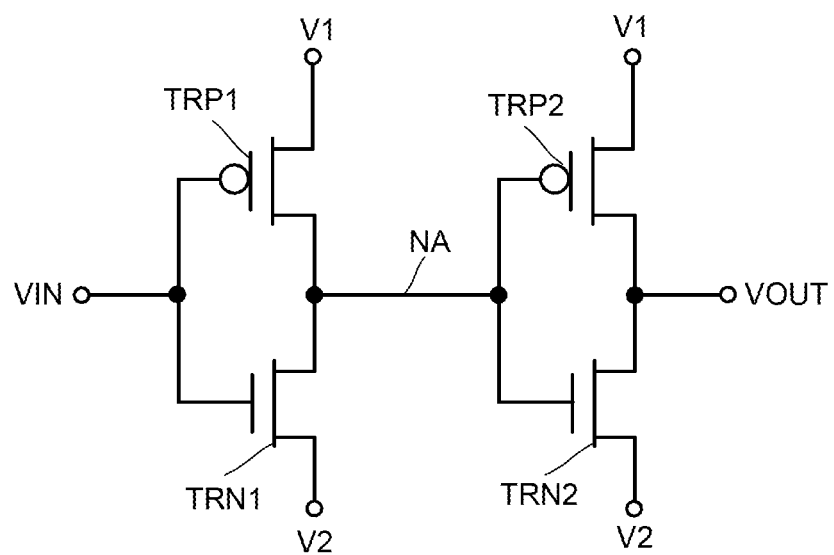
FIG. 2 is a schematic circuit diagram illustrating a first configuration example of an electronic circuit 1.

FIG. 2 is a schematic circuit diagram illustrating a first configuration example of the electronic circuit 1. The electronic circuit 1 has a transistor TRP1, a transistor TRN1, a transistor TRP2, and a transistor TRN2.

The transistors TRP1 and TRP2 are P-channel type field-effect transistors. The transistors TRN1 and TRN2 are N-channel type field-effect transistors. The transistors TRP1 and TRN1 form a first NOT gate. The transistors TRP2 and TRN2 form a second NOT gate. Examples of the electronic circuit 1 having the NOT gates include a level shift circuit.

The transistor has a gate, a source, and a drain. The transistor may further have a back gate. The source and the drain are replaced with each other in response to the structure and the operation condition of the transistor, and therefore it is difficult to limit which of them is the source or the drain. Hence, one terminal arbitrarily selected from the source and the drain is indicated as one of the source and the drain, and the other terminal is indicated as the other of the source and the drain unless otherwise stated.

The transistor TRP1 has a first gate, a first source, and a first drain. The first gate has a potential VIN changing in response to the signal IN. One of the first source and the first drain has a potential V1 changing in response to the power supply voltage VDD.

The transistor TRN1 has a second gate, a second source, and a second drain. The second gate is electrically connected to the first gate. One of the second source and the second drain has a potential V2 being equal to or lower than the ground potential in their values. The other of the second source and the second drain is electrically connected to the other of the first source and the first drain to form a node NA therebetween.

The transistor TRP2 has a third gate, a third source, and a third drain. The third gate is electrically connected to the node NA. One of the third source and the third drain has the potential V1.

The transistor TRN2 has a fourth gate, a fourth source, and a fourth drain. The fourth gate is electrically connected to the third gate. One of the fourth source and the fourth drain has the potential V2. The other of the fourth source and the fourth drain is electrically connected to the other of the third source and the third drain and has a potential VOUT of the signal OUT.

Figure 3:
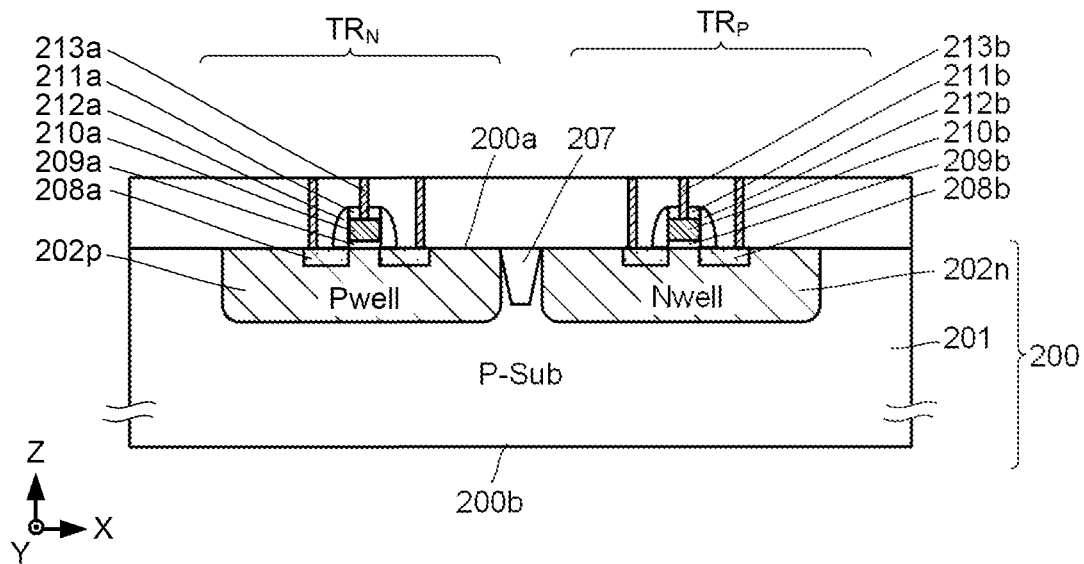
FIG. 3 is a cross-sectional schematic view illustrating a structure example of a field-effect transistor.

Here, a structure example of the transistor will be explained. FIG. 3 is a cross-sectional schematic view illustrating a structure example of the transistor. A semiconductor substrate 200 on which an N-channel type field-effect transistor $TR_N$ and a P-channel type field-effect transistor $TR_P$ are to be formed has a surface 200a and a surface 200b. FIG. 3 further illustrates a semiconductor region 201, a p-type well region (Pwell) 202p, an n-type well region (Nwell) 202n, and an element isolator 207 which are formed in the semiconductor substrate 200.

The semiconductor region 201 is a substrate region of the semiconductor substrate 200 and provided between the surface 200a and the surface 200b. An example of the surface 200a and the surface 200b extend in an X-axis direction and a Y-axis direction. An example of a thickness direction of the semiconductor substrate 200 is Z-axis direction. One of the surface 200a and the surface 200b is provided on the side opposite to the other of the surface 200a and the surface 200b.

The semiconductor region 201 may contain silicon (Si). The semiconductor region 201 may contain an acceptor impurity such as boron (B).

The p-type well region 202p is provided on the surface 200a. The p-type well region 202p contains an acceptor impurity such as boron (B). The p-type well region 202p is higher in acceptor concentration than the semiconductor region 201.

The n-type well region 202n is provided on the surface 200a. The n-type well region 202n may contain a donor impurity such as phosphor (P) or arsenic (As). The n-type well region 202n is higher in donor concentration than the semiconductor region 201. The element isolator 207 is provided between the transistor $TR_N$ and the transistor $TR_P$ to isolate the transistor $TR_N$ and the transistor $TR_P$ from each other. The element isolator 207 may contain silicon oxide.

The transistor $TR_N$ includes impurity regions 208a, a gate insulating film 209a, a gate electrode 210a, an insulating film 211a, and an insulating layer 212a. The transistor $TR_P$ includes impurity regions 208b, a gate insulating film 209b, a gate electrode 210b, an insulating film 211b, and an insulating layer 212b.

The impurity regions 208a are provided in the p-type well region 202p. The impurity regions 208a each form a source region or a drain region of the transistor $TR_N$.

The transistor $TR_N$ has a channel region between the impurity regions 208a. The impurity regions 208a contain may the donor impurity. Each impurity region 208a is connected to one of contact plugs 213a.

The impurity regions 208b are provided in the n-type well region 202n. The impurity regions 208b each form a source region or a drain region of the transistor $TR_P$.

The transistor $TR_P$ has a channel region between the impurity regions 208b. The impurity regions 208b may contain the acceptor impurity. Each impurity region 208b is connected to one of contact plugs 213b.

The gate insulating film 209a is provided above the p-type well region 202p. The gate insulating film 209b is provided above the n-type well region 202n. Each of the gate insulating films 209a and 209b may contain a silicon oxide film.

The gate electrode 210a is provided above the gate insulating film 209a. The gate electrode 210b is provided above the gate insulating film 209b. Each of the gate electrodes 210a and 210b may contain a conductive layer such as a polysilicon layer containing doped carbon, a polysilicon layer containing doped phosphor, a titanium layer, a metal nitride layer containing titanium nitride or tungsten nitride, or a tungsten layer. These conductive layers may be stacked in order to form the gate electrodes 210a and 210b. The gate electrode 210a is connected to one of the contact plugs 213a. The gate electrode 210b is connected to one of the contact plugs 213b.

The insulating film 211a is provided above the gate electrode 210a. The insulating film 211b is provided above the gate electrode 210b. The insulating films 211a and 211b may function as etching stoppers when forming contact plugs to the gate electrodes 210a and 210b. Examples of each of the insulating films 211a and 211b include a silicon nitride (SiN) film.

Each of the insulating layers 212a and 212b may include a first insulating layer and a second insulating layer provided on the first insulating layer. The first and second insulating layers are provided on a side surface of a stack of the gate electrode 210a and the insulating film 211a and a side surface of a stack of the gate electrode 210b and the insulating film 211b, respectively, and extend along a thickness direction of the stacks. Examples of the first insulating layer include a silicon dioxide ($SiO_2$) layer. Examples of the second insulating layer include a silicon nitride (SiN) layer. The insulating layers 212a and 212b may function as side walls of the transistors $TR_N$ and $TR_P$, respectively.

Radiation exposure of a field-effect transistor such as the transistors $TR_N$ or $TR_P$ may shift its threshold voltage or decrease its ON current. Such deterioration causes an operation failure of the device 10. For example, when the device is inspected by a radiation inspection device in a security gate at an airport, the transistors in the device 10 are exposed to a radiation ray. Not limited to the above, the transistors may be exposed to a radiation ray inside the device 10 of the radiation inspection device.

Figure 4:
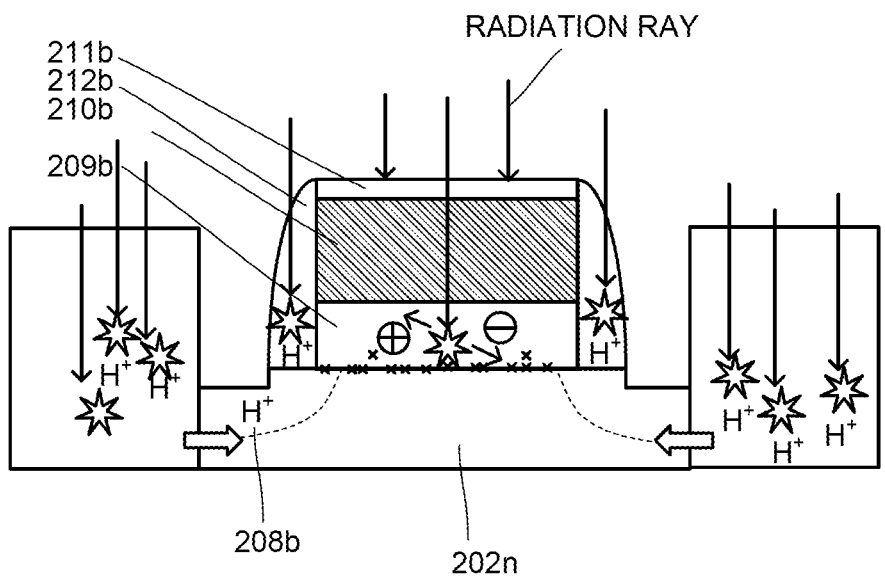
FIG. 4 is a schematic sectional view illustrating a structure example of the transistor.

A deterioration mechanism of the transistor will be further explained referring to FIG. 4. FIG. 4 is a schematic sectional view illustrating a structure example of the transistor. FIG. 4 illustrates the transistor $TR_P$ as an example, and the same also applies to the transistor $TR_N$.

Radiation exposure of the transistor $TR_P$ may generate a positive fixed charge in the gate insulating film 209b. This fixed charge may cause shift the threshold voltage.

Further, the radiation exposure of the transistor $TR_P$ may cause holes to break Si—H bonds at the interface between the channel region and the gate insulating film 209b to form an interface state. Capture of electrons into the interface state may shift the threshold voltage and decrease the ON current.

Further, when the transistor $TR_P$ receives the radiation ray, protons (ft) may be generated. The protons may be generated not only in the gate insulating film 209b and the insulating layer 212b but also at some places such as the insulating region of the element isolator 207 about the transistor $TR_P$. The protons generated about the transistor $TR_P$ enter an oxide film such as the gate insulating film 209b of the transistor $TR_P$. This shifts the threshold voltage.

In contrast to the above, the device in the embodiment performs a refresh operation when the transistor is deteriorated due to the radiation ray. The refresh operation improves the shift of the threshold voltage and the decrease in the ON current of the transistor to reduce the operation failure of the device.

Further, an operation example including the refresh operation of the device 10 will be explained below. The operation example of the device 10 includes a plurality of operations. In the explanation of each of the operations, the values of potentials and voltages are indicated by numerical values for convenience, and these values are set, for example, based on the specifications of the device 10 and not limited to the numerical values indicated below.

First Operation Example of a First Configuration Example

Figure 5:
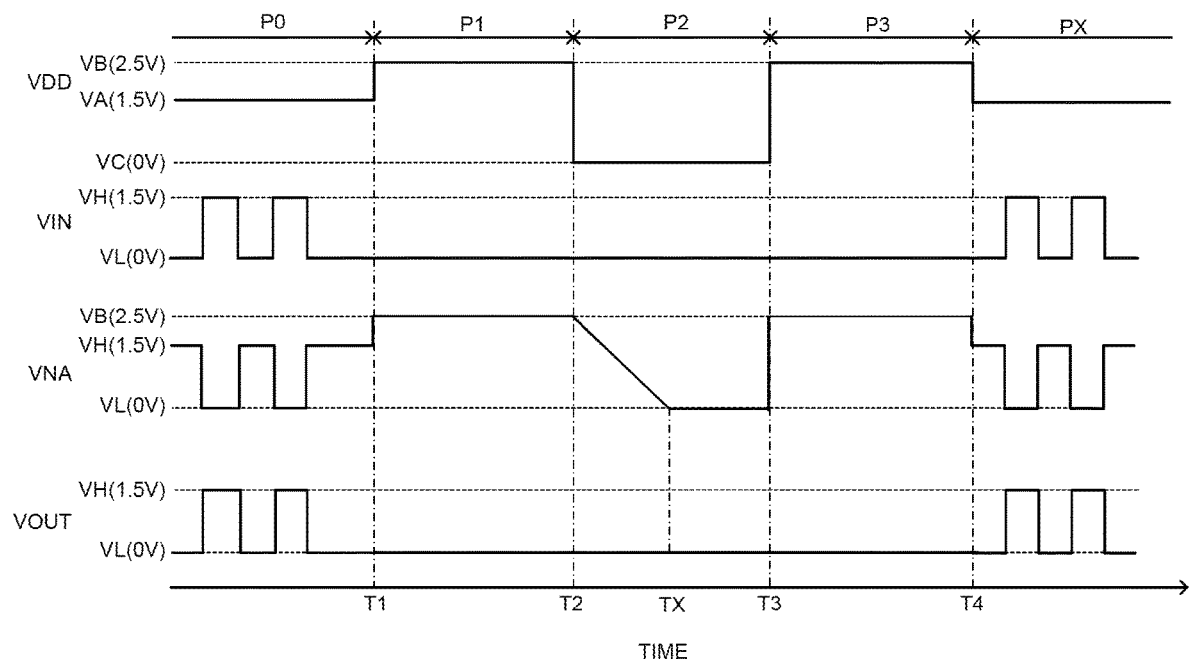
FIG. 5 is a timing chart for explaining a first operation example of a first configuration example of a semiconductor device 10.

FIG. 5 is a timing chart for explaining a first operation example of a first configuration example of the device 10. The timing chart illustrated in FIG. 5 has a period P0, a period P1, a period P2, a period P3, and a period PX. The device 10 has a normal operation mode and a refresh operation mode. Each of the operation modes will be explained below.

In the period P0, the device 10 operates in the normal operation mode. The normal operation mode causes the value of the power supply voltage VDD to be set to a value VA, the signal IN to be input into the first and second gates, and the signal OUT to be output. An example of the value VA is higher than the value of the ground potential, and is 1.5 V. An example of the potential VIN alternates between a value VH and a value VL to form pulses of the signal IN. An example of the value VL is equal to or lower than the value of the ground potential, and is 0 V. An example of the value VH is higher than the value of the ground potential, and is 1.5 V. An example of the potential VOUT alternates between the value VH and the value VL to form pulses of the signal OUT. The pulse waveforms of the signal IN and the signal OUT are not limited to the waveforms illustrated in FIG. 5.

Next, in the periods P1 to P3, the device 10 operates in the refresh operation mode. In the period P1, as illustrated in FIG. 5, the value of the potential VIN is set to the value VL before a time T1, and the value of the power supply voltage VDD changes from the value VA to a value VB at the time T1. An example of the value VB is higher than the value VA, and is 2.5 V. An example of the potential VIN can be set to the value VL by setting the potential of the signal IN to the electronic circuit 1 to the value VL. The time T1 may be set to a refresh time set in advance, or may be set referring to the signal IN as needed according to the fluctuation of the signal OUT. Further, the potential of the signal IN may be changed to a value in accordance with each operation mode using a not-illustrated signal converter circuit.

Figure 6:
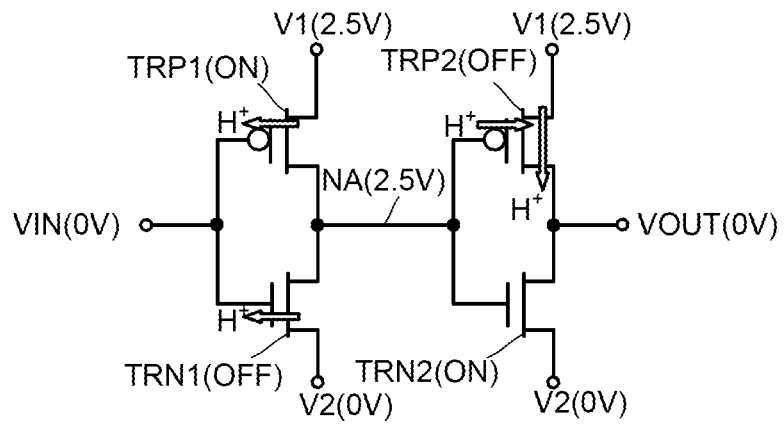
FIG. 6 is a schematic circuit diagram for explaining the operation in a period P1.

FIG. 6 is a schematic circuit diagram for explaining the operation in the period P1. In the period P1, the transistors TRP1 and TRN2 are turned into an on-state (ON), and the transistors TRN1 and TRP2 are turned into an off-state (OFF). In this event, the value of a potential VNA of the node NA changes from the value VH (1.5 V) to the value VB (2.5 V).

Further, in the period P1, a negative voltage is applied between the first gate and the first source of the transistor TRP1 so that the first gate is lower in potential than the first source of the transistor TRP1, and a negative voltage is applied between the second gate and the second drain of the transistor TRN1 so that the second gate is lower in potential than the second drain of the transistor TRN1. This can draw the protons or holes caused by the radiation ray incident on the device 10 to remove them via each of the first and second gates. In the specification, "a negative voltage between two terminals of a transistor" shows that the lower potential of the potentials of the two terminals is negative to the higher potential thereof. The operation of drawing the protons or holes via the gates in the above manner is also called a first refresh operation.

Further, in the period P1, a positive voltage is applied between the third gate and the third drain of the transistor TRP2 so that the third gate is higher in potential than the third drain of the transistor TRP2, and a positive voltage is applied between the third drain and the third source of the transistor TRP2. This can draw the protons or holes caused by the radiation ray incident on the device 10 to the channel region via the gate insulating film of the transistor TRP2, the drawn protons or holes moving in the channel region to be removed from the channel region. In the specification, "a positive voltage between two terminals of a transistor" shows that the higher potential of the potentials of the two terminals is positive to the lower potential thereof. The protons or holes drawn to the channel region may be moved into the semiconductor substrate 200 and drawn even without applying voltage thereto, and therefore it is not always necessary to move them in the channel region by applying the voltage between the drain and the source. Such an operation of removing the protons or holes via the channel region in the above manner is also called a second refresh operation.

Next, in the period P2, as illustrated in FIG. 5, the value of the power supply voltage VDD to be supplied to the electronic circuit 1 changes from the value VB to a value VC at a time T2, and the value of the potential VIN is maintained at the value VL. An example of the value VC is lower than the value VA and equal to or lower than the ground potential, and is 0 V.

Figure 7:
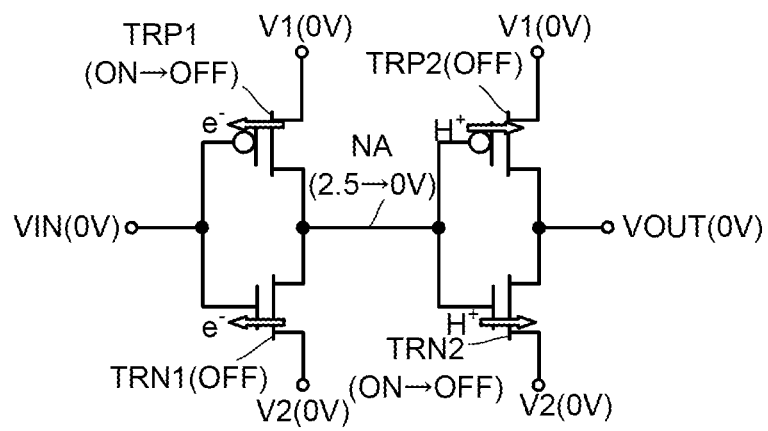
FIG. 7 is a schematic circuit diagram for explaining the operation in a period P2.

FIG. 7 is a schematic circuit diagram for explaining the operation in the period P2. In the period P2, the transistors TRP1 and TRN2 are in the on-state, and therefore the value of the potential VNA transiently changes from the value VB (2.5 V) during which the transistors TRP1 and TRN2 are turned into the off-state, and is set to the value VL at a time TX. Further, in the period P2, the transistors TRN1 and TRP2 are maintained in the off-state (OFF).

Further, in the period P2, a negative voltage is applied between the first gate and the first drain of the transistor TRP1 so that the first gate is lower in potential than the first drain of the transistor TRP1, a positive voltage is applied between the first drain and the first source of the transistor TRP1, a negative voltage is applied between the second gate and the second drain of the transistor TRN1 so that the second gate is lower in potential than the second drain of the transistor TRN1, and a positive voltage is applied between the second drain and the second source of the transistor TRN1. This can inject hot electrons into the gate insulating films of the transistors TRP1 and TRN1 via the channel regions. This can neutralize the protons or holes, which are caused by the radiation ray incident on the device 10, in the gate insulating films. The operation of neutralizing the protons or holes by the hot electrons in this manner is also called a third refresh operation.

Further, in the period P2, a positive voltage is applied between the third gate and the third source of the transistor TRP2 so that the third gate is higher in potential than the third source of the transistor TRP2, and a positive voltage is applied between the fourth gate and the fourth source of the transistor TRN2 so that the fourth gate is higher in potential than the fourth source of the transistor TRN2. This can draw the protons or holes caused by the radiation ray incident on the device 10 to remove them via each of the gate insulating films of the transistors TRP2 and TRN2.

Next, in the period P3, as illustrated in FIG. 5, the value of the power supply voltage VDD to be supplied to the electronic circuit 1 changes from the value VC (0 V) to the value VB (2.5 V) at a time T3, and the value of the potential VIN is maintained at the value VL (0 V).

Figure 8:
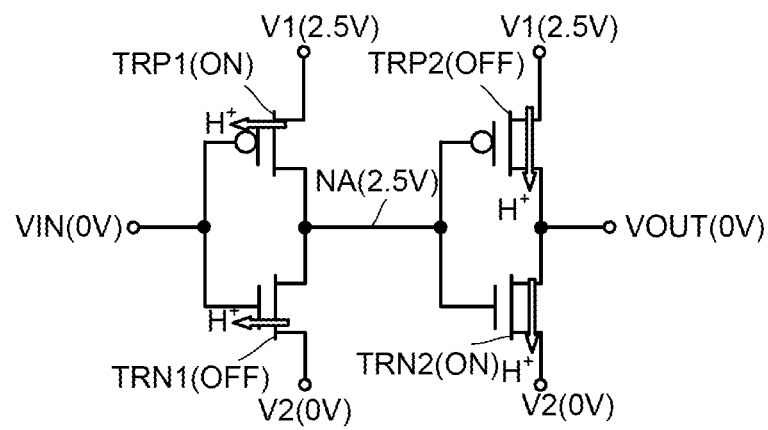
FIG. 8 is a schematic circuit diagram for explaining the operation in a period P3.

FIG. 8 is a schematic circuit diagram for explaining the operation in the period P3. In the period P3, the transistors TRP1 and TRN2 are turned into the on-state (ON), and the transistors TRN1 and TRP2 are turned into the off-state (OFF). In this event, the value of the potential VNA changes from the value VL (0 V) to the value VB (2.5 V).

Further, in the period P3, a negative voltage is applied between the first gate and the first source of the transistor TRP1 so that the first gate is lower in potential than the first source of the transistor TRP1, and a negative voltage is applied between the second gate and the second drain of the transistor TRN1 so that the second gate is lower in potential than the second drain of the transistor TRN1. This can draw the protons or holes caused by the radiation ray incident on the device 10 to remove via each of the first and second gates.

Further, in the period P3, a positive voltage is applied between the third drain and the third source of the transistor TRP2, and a positive voltage is applied between the fourth gate and the fourth source of the transistor TRN2. This can move the protons or holes caused by the radiation ray incident on the device 10 into the channel regions of the transistors TRP2 and TRN2 to remove the protons or holes. The protons or holes are drawn to the channel region via the gate insulating film in the transistor TRN2.

Thereafter, in the period PX, the device 10 operates in the normal operation mode again after a time T4. The above is the explanation of the first operation example.

Second Operation Example of the First Configuration Example

Figure 9:
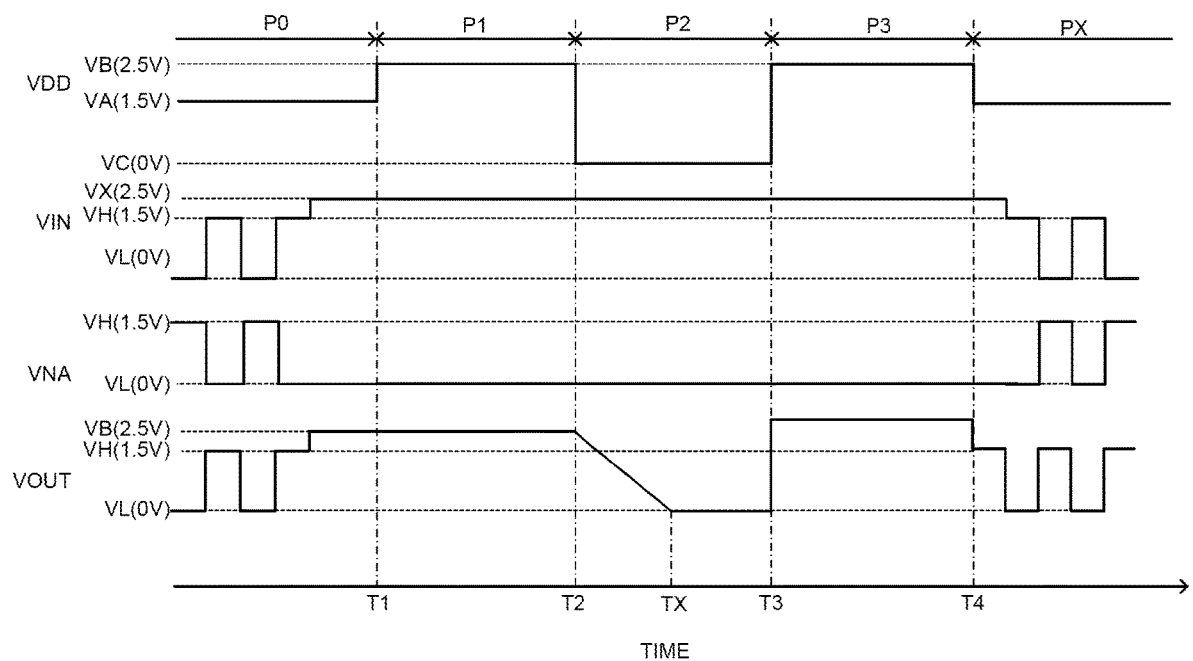
FIG. 9 is a timing chart for explaining a second operation example of the first configuration example of the electronic circuit 1.

FIG. 9 is a timing chart for explaining a second operation example of the first configuration example of the electronic circuit 1. The second operation example of the first configuration example is different in the value of the potential VIN in the periods P1 to P3 as compared with the first operation example of the first configuration example. A portion of the second operation example different from that in the first operation example will be explained below, and the explanation of the first operation example can be appropriately employed for the other portion.

In the periods P1 to P3, the device 10 operates in the refresh operation mode. In the period P1, as illustrated in FIG. 9, the value of the potential VIN is set to the value VB (2.5 V) before the time T1, and the value of the power supply voltage VDD to be supplied to the electronic circuit 1 changes from the value VA (1.5 V) to the value VB (2.5 V) at the time T1. The time T1 may be set to the same timing as the correction of the other electronic circuit, or may be set according to the time until the gate capacitance of the transistor connected to the potential VIN is charged.

Figure 10:
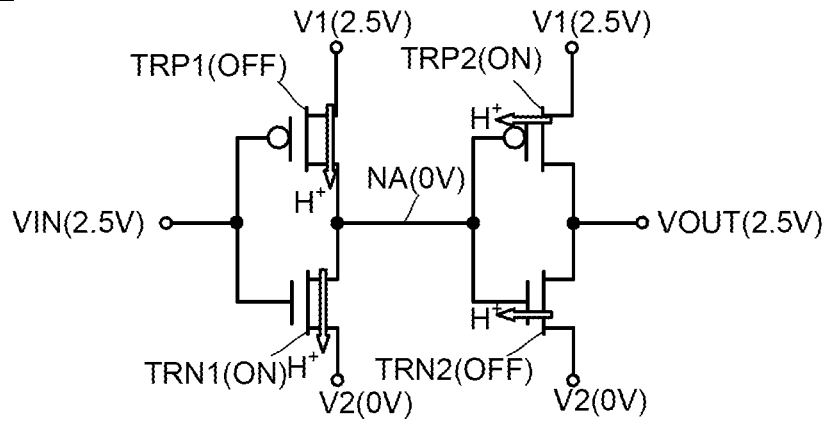
FIG. 10 is a schematic circuit diagram for explaining the operation in the period P1.

FIG. 10 is a schematic circuit diagram for explaining the operation in the period P1. In the period P1, the transistors TRP1 and TRN2 are turned into the off-state (OFF), and the transistors TRN1 and TRP2 are turned into the on-state (ON). In this event, the value of the potential VNA of the node NA is maintained at the value VL (0 V), and the value of the potential of the signal OUT is maintained at the value VB (2.5 V).

Further, in the period P1, a negative voltage is applied between the third gate and the third source of the transistor TRP2 so that the third gate is lower in potential than the third source of the transistor TRP2, and a negative voltage is applied between the fourth gate and the fourth drain of the transistor TRN2 so that the fourth gate is lower in potential than the fourth drain of the transistor TRN2. This can draw the protons or holes caused by the radiation ray incident on the device 10 to remove them via each of the third and fourth gates.

Further, in the period P1, a positive voltage is applied between the first drain and the first source of the transistor TRP1, and a positive voltage is applied between the second gate and the second source of the transistor TRN1 so that the second gate is higher in potential than the second source of the transistor TRN1. This can move the protons or holes caused by the radiation ray incident on the device 10 into the channel regions of the transistors TRP1 and TRN1 to remove the protons or holes. The protons or holes are drawn to the channel region via the gate insulating film in the transistor TRN1.

Next, in the period P2, as illustrated in FIG. 9, the value of the power supply voltage VDD to be supplied to the electronic circuit 1 changes from the value VB (2.5 V) to the value VC (0 V) at the time T2, and the value of the potential VIN is maintained at the value VX (2.5 V).

Figure 11:
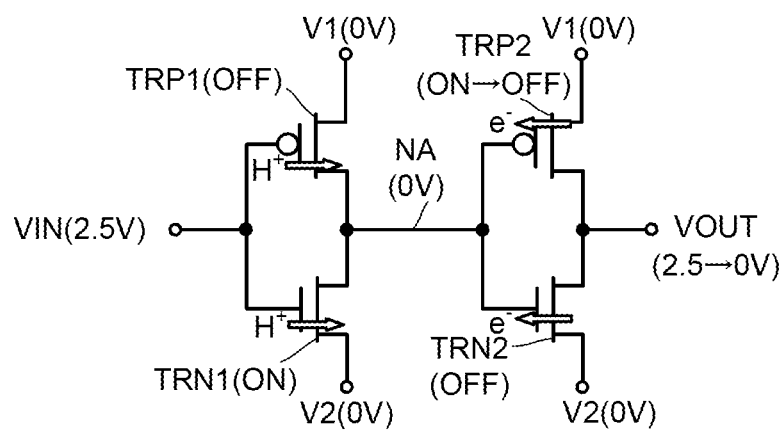
FIG. 11 is a schematic circuit diagram for explaining the operation in the period P2.

FIG. 11 is a schematic circuit diagram for explaining the operation in the period P2. In the period P2, the transistors TRN1 and TRP2 are in the on-state (ON), and therefore the value of the potential VOUT of the signal OUT transiently changes from the value VB (2.5 V) during which the transistor TRP2 is turned into the off-state, and is set to the value VL (0 V) at the time VX. Further, in the period P2, the transistor TRN1 is maintained in the on-state and the transistors TRP1 and TRN2 are maintained in the off-state (OFF).

Further, in the period P2, a negative voltage is applied between the third gate and the third drain of the transistor TRP2 so that the third gate is lower in potential than the third drain of the transistor TRP2, a positive voltage is applied between the third drain and the third source of the transistor TRP2, a negative voltage is applied between the fourth gate and the fourth drain of the transistor TRN2 so that the fourth gate is lower in potential than the fourth drain of the transistor TRN2, and a positive voltage is applied between the fourth drain and the fourth source of the transistor TRN2 at the time T2. This can inject hot electrons into the gate insulating films of the transistors TRP2 and TRN2 via the channel regions. This can neutralize the protons or holes, which are caused by the radiation ray incident on the device 10, in the gate insulating films.

Further, in the period P2, a positive voltage is applied between the first gate and the first source of the transistor TRP1 so that the first gate is higher in potential than the first source of the transistor TRP1, and a positive voltage is applied between the second gate and the second source of the transistor TRN1 so that the second gate is higher in potential than the second source of the transistor TRN1. This can draw the protons or holes caused by the radiation ray incident on the device 10 to remove via each of the gate insulating films of the transistors TRP1 and TRN1.

Next, in the period P3, as illustrated in FIG. 9, the value of the power supply voltage VDD to be supplied to the electronic circuit 1 changes from the value VC (0 V) to the value VB (2.5 V) at the time T3, and the value of the potential VIN is maintained at the value VX (2.5 V).

Figure 12:
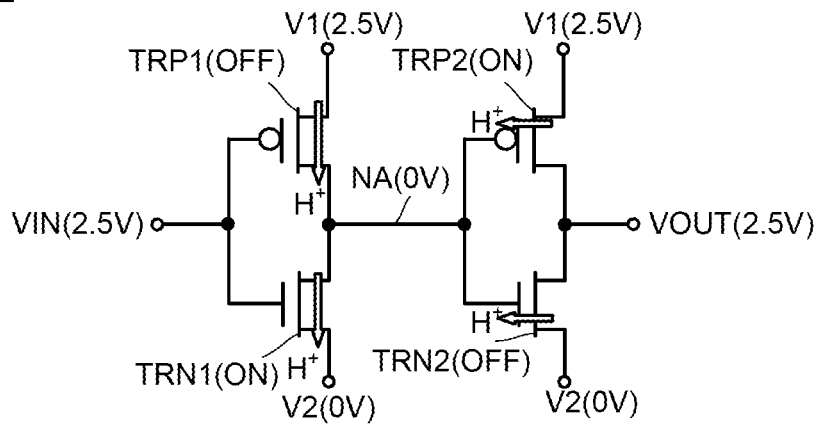
FIG. 12 is a schematic circuit diagram for explaining the operation in the period P3.

FIG. 12 is a schematic circuit diagram for explaining the operation in the period P3. In the period P3, the transistors TRP1 and TRN2 are turned into the off-state (OFF), and the transistors TRN1 and TRP2 are turned into the on-state (ON). In this event, the value of the potential VNA of the node NA is maintained at the value VL (0 V), and the value of the potential VOUT of the signal OUT changes from the value VL (0 V) to the value VB (2.5 V).

Further, in the period P3, a negative voltage is applied between the third gate and the third source of the transistor TRP2 so that the third gate is lower in potential than the third source of the transistor TRP2, and a negative voltage is applied between the fourth gate and the fourth drain of the transistor TRN2 so that the fourth gate is lower in potential than the fourth drain of the transistor TRN2. This can remove the protons or holes caused by the radiation ray incident on the device 10 via each of the third and fourth gates.

Further, in the period P3, a positive voltage is applied between the first drain and the first source of the transistor TRP1, and a positive voltage is applied between the second gate and the second source of the transistor TRN1 so that the second gate is higher in potential than the second source of the transistor TRN1. This can move the protons or holes caused by the radiation ray incident on the device 10 into the channel regions of the transistors TRP1 and TRN1 to remove them. The protons or holes are drawn to the channel region via the gate insulating film in the transistor TRN1.

Thereafter, in the period PX, the device 10 operates in the normal operation mode again after the time T4. The above is the explanation of the second operation example.

Second Configuration Example of the Electronic Circuit 1

Figure 13:
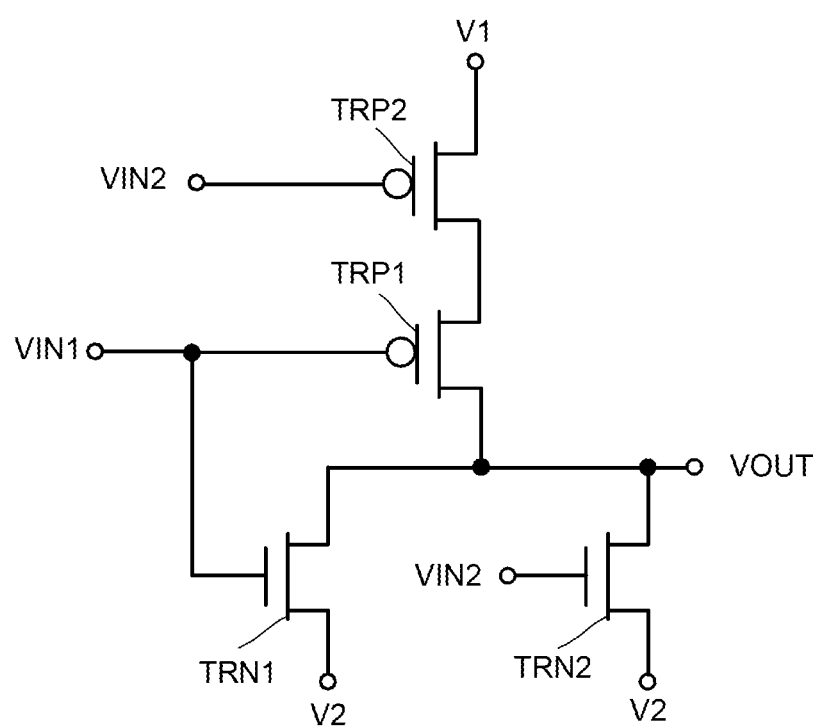
FIG. 13 is a schematic circuit diagram illustrating a second configuration example of the electronic circuit 1.

FIG. 13 is a schematic circuit diagram illustrating a second configuration example of the electronic circuit 1. The electronic circuit 1 has a transistor TRP1, a transistor TRN1, a transistor TRP2, and a transistor TRN2.

The transistors TRP1 and TRP2 are P-channel type field-effect transistors. The transistors TRN1 and TRN2 are N-channel type field-effect transistors. The transistors TRP1, TRN1, TRP2 and TRN2 form a NOR gate. The explanation of the first configuration example can be appropriately employed for the structures of the transistors.

The transistor TRP1 has a first gate, a first source, and a first drain. The first gate has a potential VIN1 changing in response to a signal IN1. The potential of one of the first source and the first drain changes in accordance with the state of the transistor TRP2.

The transistor TRN1 has a second gate, a second source, and a second drain. The second gate is electrically connected to the first gate. One of the second source and the second drain has a potential V2 being equal to or lower than the ground potential. The other of the second source and the second drain is electrically connected to the other of the first source and the first drain of the transistor TRP1.

The transistor TRP2 has a third gate, a third source, and a third drain. The third gate has a potential VIN2 changing in response to a signal IN2. One of the third source and the third drain has a potential V1 changing in response to the power supply voltage VDD. The other of the third source and the third drain is electrically connected to one of the first source and the first drain of the transistor TRP1.

The transistor TRN2 has a fourth gate, a fourth source, and a fourth drain. The fourth gate has the potential VIN2. One of the fourth source and the fourth drain has the potential V2. The other of the fourth source and the fourth drain is electrically connected to the other of the first source and the first drain of the transistor TRP1 and to the other of the second source and the second drain of the transistor TRN1 and has a potential VOUT of a signal OUT.

Next, an operation example of the device 10 will be explained. The operation example of the device 10 includes a plurality of operation examples. In the explanation of each of the operations, the values of potentials and voltage are indicated by numerical values for convenience, and these values are set, for example, based on the specifications of the device 10 and not limited to the numerical values indicated below.

First Operation Example of a Second Configuration Example

Figure 14:
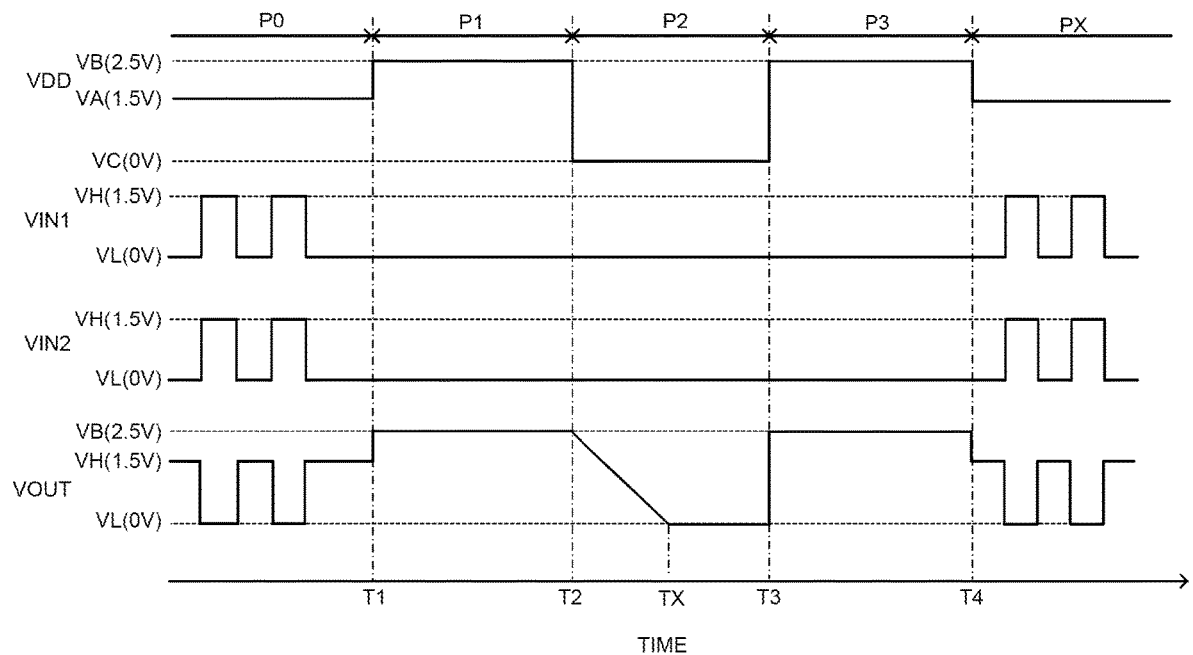
FIG. 14 is a timing chart for explaining a first operation example of a second configuration example of the device 10.

FIG. 14 is a timing chart for explaining a first operation example of a second configuration example of the device 10. The timing chart illustrated in FIG. 14 has a period P0, a period P1, a period P2, a period P3, and a period PX. The device 10 has a normal operation mode and a refresh operation mode. Each of the operation modes will be explained below.

In the period P0, the device 10 operates in the normal operation mode. In the normal operation mode, the value of the power supply voltage VDD is set to a value VA, the signal IN1 is input into the first and second gates, the signal IN2 is input into the third and fourth gates, and the signal OUT is output. An example of the value VA is higher than the value of the ground potential, and is 1.5 V. An example of the potential VIN1 alternates between a value VH and a value VL to form pulses of the signal IN1. The potential VIN2 alternates between a value VH and a value VL to form pulses of the signal IN2. An example of the value VL is equal to or lower than the value of the ground potential, and is 0 V. An example of the value VH is higher than the value of the ground potential, and is 1.5 V. An example of the potential VOUT alternates between the value VH and the value VL to form pulses of the signal OUT. The signal IN1 and the signal IN2 may be different in waveform from each other.

Next, in the period P1 to P3, the device 10 operates in the refresh operation mode. In the period P1, as illustrated in FIG. 14, the values of the potentials VIN1, VIN2 are set to the value VL before a time T1, and the value of the power supply voltage VDD to be supplied to the electronic circuit 1 changes from the value VA to a value VB at the time T1. An example of the value VB is higher than the value VA, and is 2.5 V. An example of the potentials VIN1, VIN2 can be set to the value VL by stopping the input of the signals IN1, IN2 into the device 10.

Figure 15:
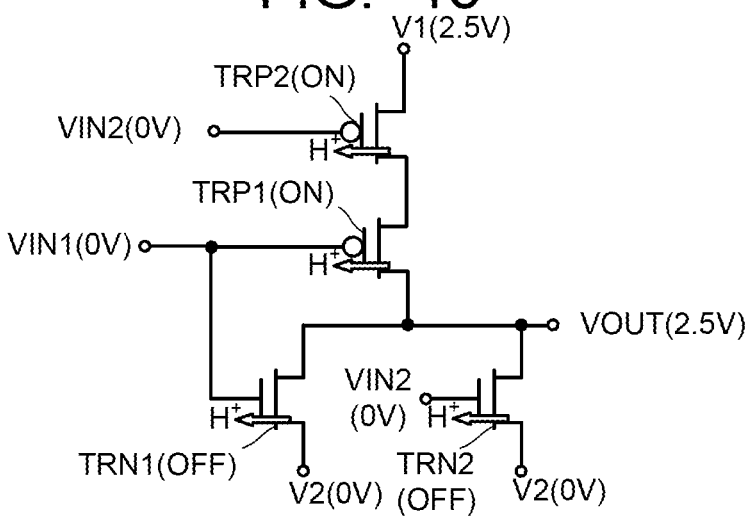
FIG. 15 is a schematic circuit diagram for explaining the operation in the period P1.

FIG. 15 is a schematic circuit diagram for explaining the operation in the period P1. In the period P1, the transistors TRP1 and TRP2 are turned into the on-state (ON), and the transistors TRN1 and TRN2 are turned into the off-state (OFF). In this event, the value of the potential VOUT changes from the value VH (1.5 V) to the value VB (2.5 V).

Further, in the period P1, a negative voltage is applied between the first gate and the first source of the transistor TRP1 so that the first gate is lower in potential than the first source of the transistor TRP1, a negative voltage is applied between the second gate and the second drain of the transistor TRN1 so that the second gate is lower in potential than the second drain of the transistor TRN1, a negative voltage is applied between the third gate and the third source of the transistor TRP2 so that the third gate is lower in potential than the third source of the transistor TRP2, and a negative voltage is applied between the fourth gate and the fourth drain of the transistor TRN2 so that the fourth gate is lower in potential than the fourth drain of the transistor TRN2. This can draw the protons or holes caused by the radiation ray incident on the device 10 to remove via each of the first to fourth gates.

Next, in the period P2, as illustrated in FIG. 14, the value of the power supply voltage VDD to be supplied to the electronic circuit 1 changes from the value VB to a value VC at a time T2, and the values of the potentials VIN1, VIN2 are maintained at the value VL. An example of the value VC is lower than the value VA and equal to or lower than the ground potential, and is 0 V.

Figure 16:
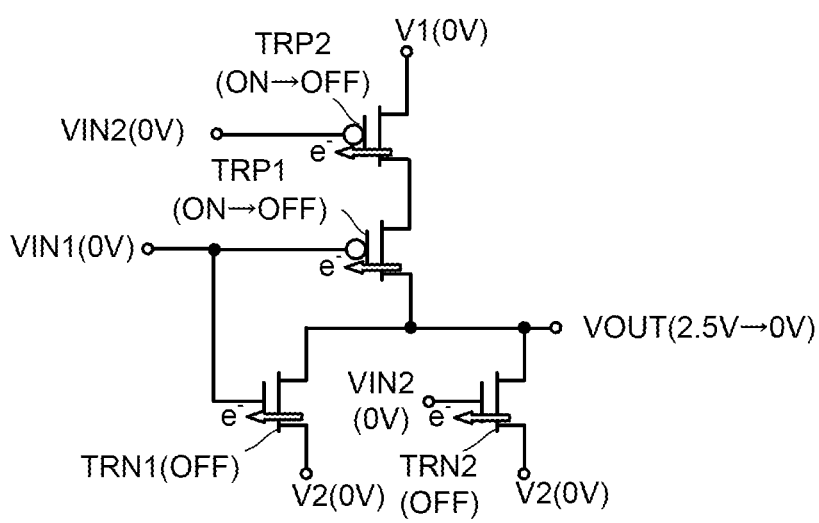
FIG. 16 is a schematic circuit diagram for explaining the operation in the period P2.

FIG. 16 is a schematic circuit diagram for explaining the operation in the period P2. In the period P2, the transistors TRP1 and TRP2 are in the on-state, and therefore the value of the potential VOUT transiently changes from the value VB (2.5 V) during which the transistors TRP1 and TRN2 are turned into the off-state, and is set to the value VL (0 V) at a time TX. Further, in the period P2, the transistors TRN1 and TRN2 are maintained in the off-state (OFF).

Further, in the period P2, a negative voltage is applied between the first gate and the first drain of the transistor TRP1 so that the first gate is lower in potential than the first drain of the transistor TRP1, a positive voltage is applied between the first drain and the first source of the transistor TRP1, a negative voltage is applied between the second gate and the second drain of the transistor TRN1 so that the second gate is lower in potential than the second drain of the transistor TRN1, a positive voltage is applied between the second drain and the second source of the transistor TRN1, a negative voltage is applied between the third gate and the third drain of the transistor TRP2 so that the third gate is lower in potential than the third drain of the transistor TRP2, a positive voltage is applied between the third drain and the third source of the transistor TRP2, a negative voltage is applied between the fourth gate and the fourth drain of the transistor TRN2 so that the fourth gate is lower in potential than the fourth drain of the transistor TRN2, and a positive voltage is applied between the fourth drain and the fourth source of the transistor TRN2. This can inject hot electrons into the gate insulating films of the transistors TRP1, TRP2, TRN1 and TRN2 via the channel regions. This can neutralize the protons or holes, which are caused by the radiation ray incident on the device 10, in the gate insulating films.

Next, in the period P3, as illustrated in FIG. 14, the value of the power supply voltage VDD to be supplied to the electronic circuit 1 changes from the value VC (0 V) to the value VB (2.5 V) at a time T3, and the values of the potentials VIN1, VIN2 are maintained at the value VL (0 V).

Figure 17:
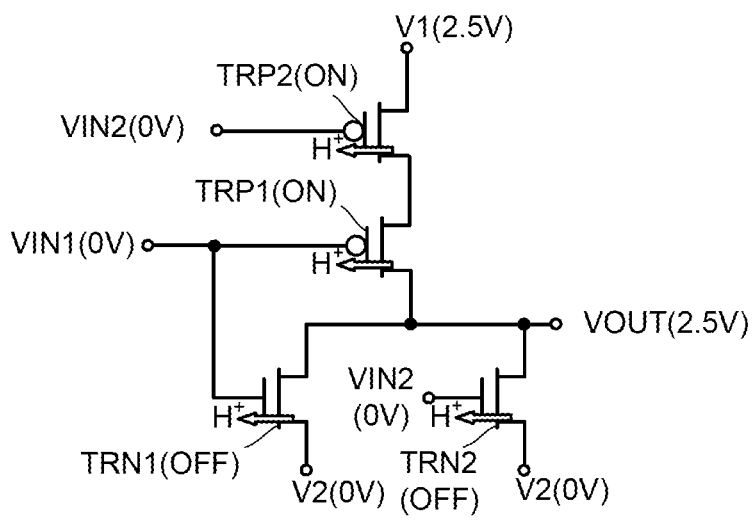
FIG. 17 is a schematic circuit diagram for explaining the operation in the period P3.

FIG. 17 is a schematic circuit diagram for explaining the operation in the period P3. In the period P3, the transistors TRP1 and TRP2 are turned into the on-state (ON), and the transistors TRN1 and TRN2 are turned into the off-state (OFF). In this event, the value of the potential VOUT changes from the value VL (0 V) to the value VB (2.5 V).

Further, in the period P3, a negative voltage is applied between the first gate and the first source of the transistor TRP1 so that the first gate is lower in potential than the first source of the transistor TRP1, a negative voltage is applied between the second gate and the second source of the transistor TRN1 so that the second gate is lower in potential than the second source of the transistor TRN1, a negative voltage is applied between the third gate and the third source of the transistor TRP2 so that the third gate is lower in potential than the third source of the transistor TRP2, and a negative voltage is applied between the fourth gate and the fourth source of the transistor TRN2 so that the fourth gate is lower in potential than the fourth source of the transistor TRN2. This can remove the protons or holes caused by the radiation ray incident on the device 10 via each of the first to fourth gates.

Thereafter, in the period PX, the device 10 operates in the normal operation mode again after a time T4. The above is the explanation of the first operation example.

Second Operation Example of the Second Configuration Example

Figure 18:
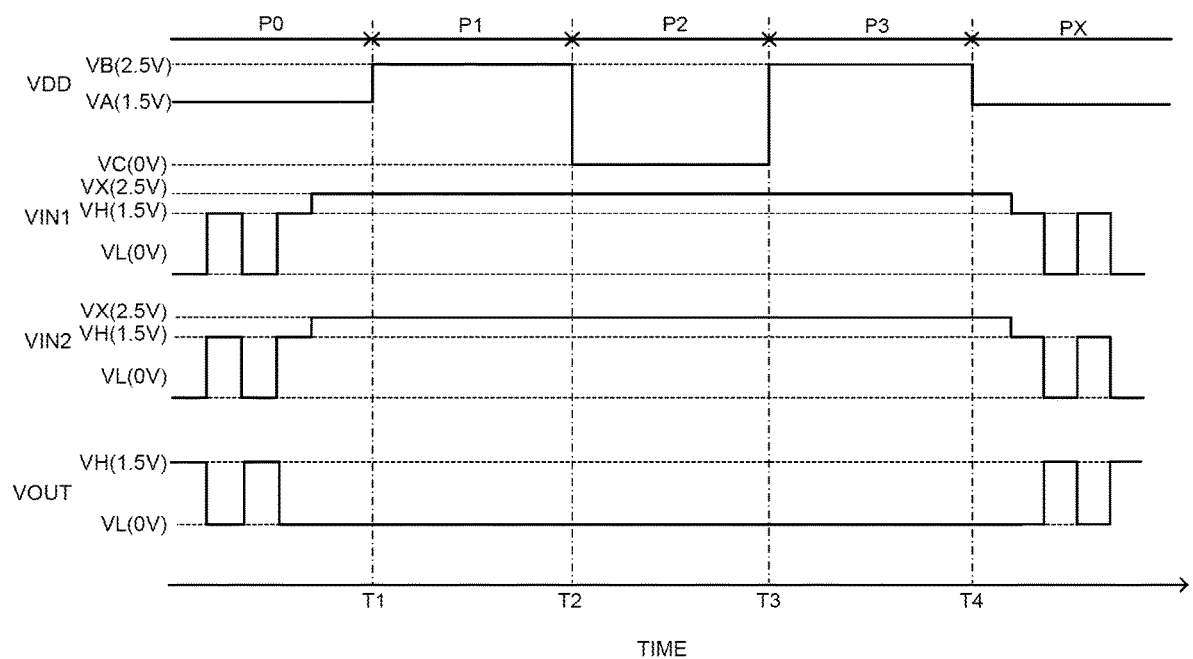
FIG. 18 is a timing chart for explaining a second operation example of a second configuration example of the electronic circuit 1.

FIG. 18 is a timing chart for explaining a second operation example of the second configuration example of the electronic circuit 1. The second operation example of the second configuration example is different in the values of the potentials VIN1, VIN2 in the periods P1 to P3 as compared with the first operation example of the second configuration example. A portion of the second operation example different from that in the first operation example will be explained below, and the explanation of the first operation example can be appropriately employed for the other portion.

In the periods P1 to P3, the device 10 operates in the refresh operation mode. In the period P1, as illustrated in FIG. 18, the values of the potentials VIN1, VIN2 are set to the value VX (2.5 V) before the time T1, and the value of the power supply voltage VDD to be supplied to the electronic circuit 1 changes from the value VA (1.5 V) to the value VB (2.5 V) at the time T1.

Figure 19:
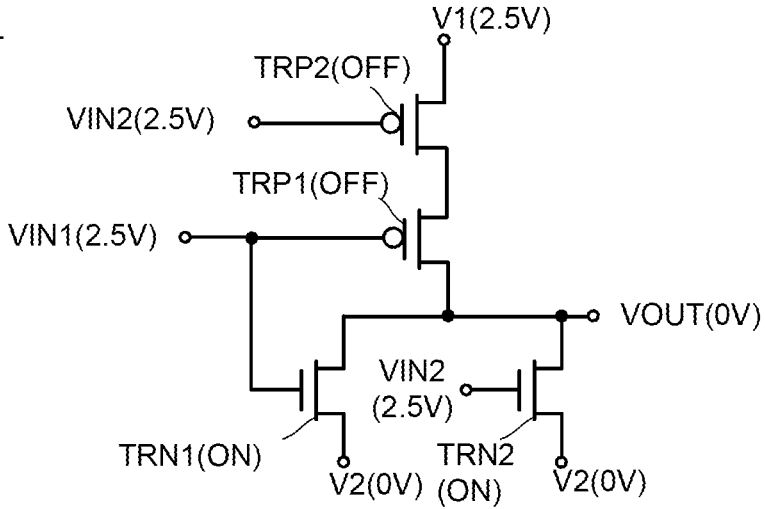
FIG. 19 is a schematic circuit diagram for explaining the operation in the period P1.

FIG. 19 is a schematic circuit diagram for explaining the operation in the period P1. In the period P1, the transistors TRP1 and TRP2 are turned into the off-state (OFF), and the transistors TRN1 and TRN2 are turned into the on-state (ON). In this event, the value of the potential VOUT is maintained at the value VL (0 V).

Next, in the period P2, as illustrated in FIG. 18, the value of the power supply voltage VDD to be supplied to the electronic circuit 1 changes from the value VB (2.5 V) to the value VC (0 V) at the time T2, and the values of the potential VIN1, VIN2 are maintained at the value VX (2.5 V).

Figure 20:
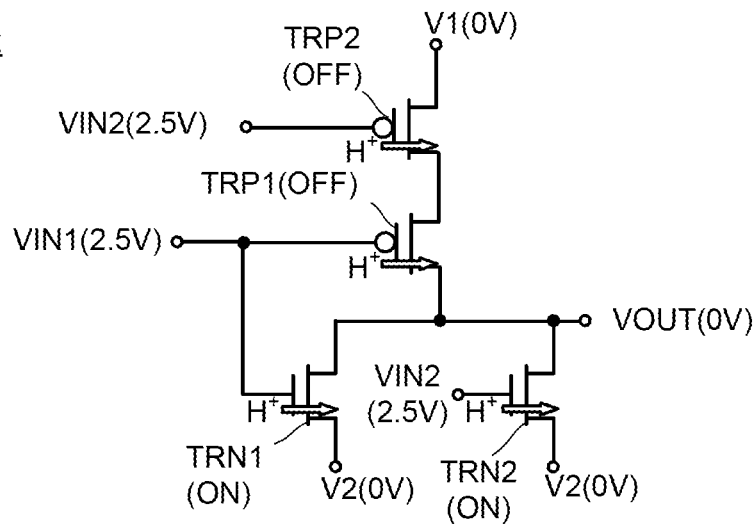
FIG. 20 is a schematic circuit diagram for explaining the operation in the period P2.

FIG. 20 is a schematic circuit diagram for explaining the operation in the period P2. In the period P2, the transistors TRN1 and TRN2 are maintained in the on-state, and therefore the value of the potential VOUT is maintained at the value VL (0 V). Further, in the period P2, the transistors TRP1 and TRP2 are maintained in the off-state (OFF).

Further, in the period P2, a positive voltage is applied between the first gate and the first source of the transistor TRP1 so that the first gate is higher in potential than the first source of the transistor TRP1, a positive voltage is applied between the second gate and the second source of the transistor TRN1 so that the second gate is higher in potential than the second source of the transistor TRN1, a positive voltage is applied between the third gate and the third source of the transistor TRP2 so that the third gate is higher in potential than the third source of the transistor TRP2, and a positive voltage is applied between the fourth gate and the fourth source of the transistor TRN2 so that the fourth gate is higher in potential than the fourth source of the transistor TRN2. This can draw the protons or holes caused by the radiation ray incident on the device 10 to remove them via each of the gate insulating films of the transistor TRP1, TRN1, TRP2 and TRN2.

Next, in the period P3, as illustrated in FIG. 18, the value of the power supply voltage VDD to be supplied to the electronic circuit 1 changes from the value VC (0 V) to the value VB (2.5 V) at the time T3, and the values of the potentials VIN1, VIN2 are maintained at the value VX (2.5 V).

Figure 21:
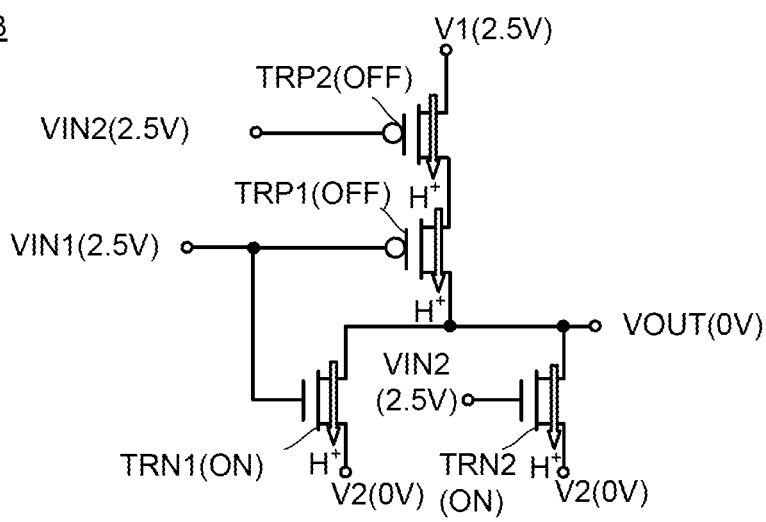
FIG. 21 is a schematic circuit diagram for explaining the operation in the period P3.

FIG. 21 is a schematic circuit diagram for explaining the operation in the period P3. In the period P3, the transistors TRN1 and TRN2 are maintained in the on-state (ON), and therefore the value of the potential VOUT is maintained at the value VL (0 V). Further, in the period P3, the transistors TRP1 and TRP2 are maintained in the off-state (OFF).

Further, in the period P3, a positive voltage is applied between the first drain and the first source of the transistor TRP1, a positive voltage is applied between the second gate and the second source of the transistor TRN1 so that the second gate is higher in potential than the second source of the transistor TRN1, a positive voltage is applied between the third drain and the third source of the transistor TRP2, and a positive voltage is applied between the fourth gate and the fourth source of the transistor TRN2 so that the fourth gate is higher in potential than the fourth source of the transistor TRN2. This can move the protons or holes caused by the radiation ray incident on the device 10 into the channel regions of the transistors TRP1, TRN1, TRP2 and TRN2 to remove them. The protons or holes are drawn to the channel regions via the gate insulating films in the transistors TRN1 and TRN2.

Thereafter, in the period PX, the device 10 operates in the normal operation mode again after the time T4. The above is the explanation of the second operation example.

Third Configuration Example of the Electronic Circuit 1

Figure 22:
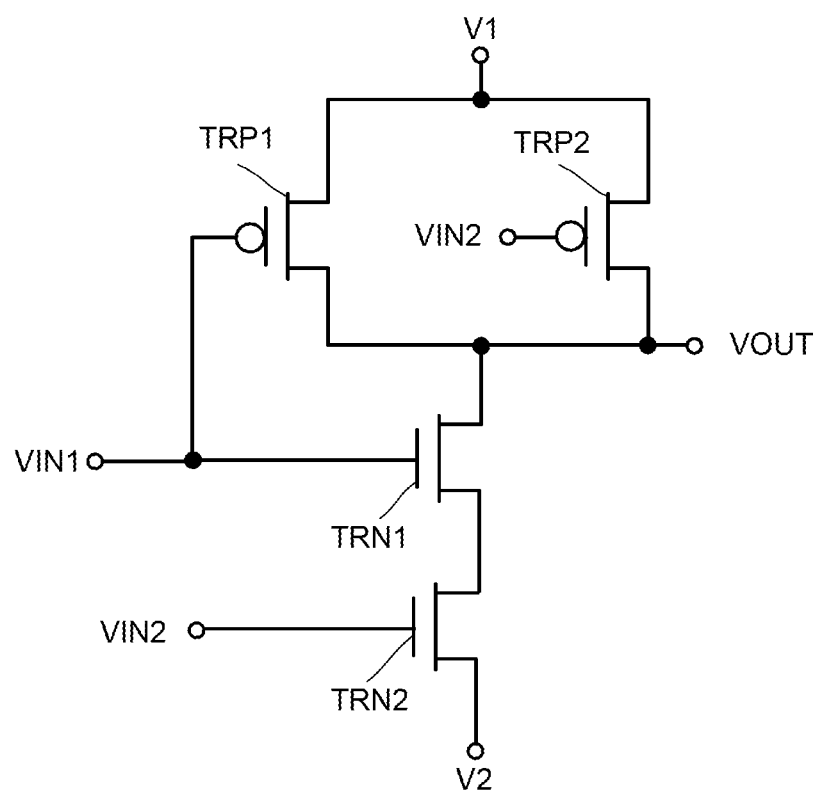
FIG. 22 is a schematic circuit diagram illustrating a third configuration example of the electronic circuit 1.

FIG. 22 is a schematic circuit diagram illustrating a third configuration example of the electronic circuit 1. The electronic circuit 1 has a transistor TRP1, a transistor TRN1, a transistor TRP2, and a transistor TRN2.

The transistors TRP1 and TRP2 are P-channel type field-effect transistors. The transistors TRN1 and TRN2 are N-channel type field-effect transistors. The transistors TRP1, TRN1, TRP2 and TRN2 form a NAND gate. The explanation of the first configuration example can be appropriately employed for the structures of the transistors.

The transistor TRP1 has a first gate, a first source, and a first drain. The first gate has a potential VIN1 changing in response to a signal IN1. One of the first source and the first drain has a potential V1 changing in response to the power supply voltage VDD.

The transistor TRN1 has a second gate, a second source, and a second drain. The second gate is electrically connected to the first gate. The potential of one of the second source and the second drain changes in accordance with the state of the transistor TRN2. The other of the second source and the second drain is electrically connected to the other of the first source and the first drain of the transistor TRP1 and has the potential VOUT of the signal OUT.

The transistor TRP2 has a third gate, a third source, and a third drain. The third gate has a potential VIN2 changing depending on a signal IN2. One of the third source and the third drain has the potential V1. The other of the third source and the third drain is electrically connected to the other of the second source and the second drain of the transistor TRN1.

The transistor TRN2 has a fourth gate, a fourth source, and a fourth drain. The fourth gate has the potential VIN2. One of the fourth source and the fourth drain has the potential V2. The other of the fourth source and the fourth drain is electrically connected to one of the second source and the second drain of the transistor TRN1.

Next, an operation example of the device 10 will be explained. The operation example of the device 10 includes a plurality of operation examples. In the explanation of each of the operations, the values of potentials and voltages are indicated by numerical values for convenience, and these values are set, for example, according to the specifications of the device 10 and not limited to the numerical values indicated below.

First Operation Example of a Third Configuration Example

Figure 23:
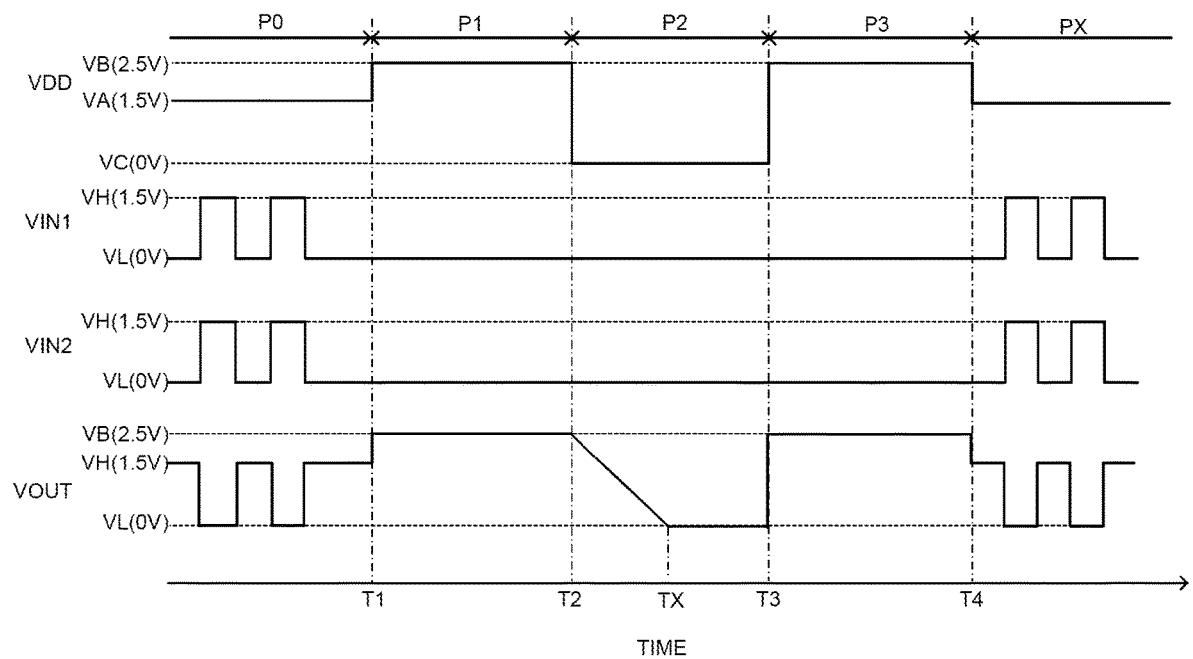
FIG. 23 is a timing chart for explaining a first operation example of a third configuration example of the device 10.

FIG. 23 is a timing chart for explaining a first operation example of a third configuration example of the device 10. The timing chart illustrated in FIG. 23 has a period P0, a period P1, a period P2, a period P3, and a period PX. The device 10 has a normal operation mode and a refresh operation mode. Each of the operation modes will be explained below.

In the period P0, the device 10 operates in the normal operation mode. In the normal operation mode, the value of the power supply voltage VDD is set to a value VA, the signal IN1 is input into the first and second gates, the signal IN2 is input into the third and fourth gates, and the signal OUT is output. An example of the value VA is higher than the value of the ground potential, and is 1.5 V. An example of the potential VIN1 alternates between a value VH and a value VL to form pulses of the signal IN1. An example of the potential VIN2 alternates between the value VH and the value VL to form pulses of the signal IN2. An example of the value VL is equal to or lower than the value of the ground potential, and is 0 V. An example of the value VH is higher than the value of the ground potential, and is 1.5 V. An example of the potential VOUT alternates between the value VH and the value VL to form pulses of the signal OUT. The signal IN1 and the signal IN2 may be different in waveform from each other.

Next, in the periods P1 to P3, the device 10 operates in the refresh operation mode. In the period P1, as illustrated in FIG. 23, the values of the potential VIN1, VIN2 are set to the value VL before a time T1, and the value of the power supply voltage VDD to be supplied to the electronic circuit 1 changes from the value VA to a value VB at the time T1. An example of the value VB is higher than the value VA, and is 2.5 V. An example of the potentials VIN1, VIN2 can be set to the value VL by stopping the input of the signals IN1, IN2 into the device 10.

Figure 24:
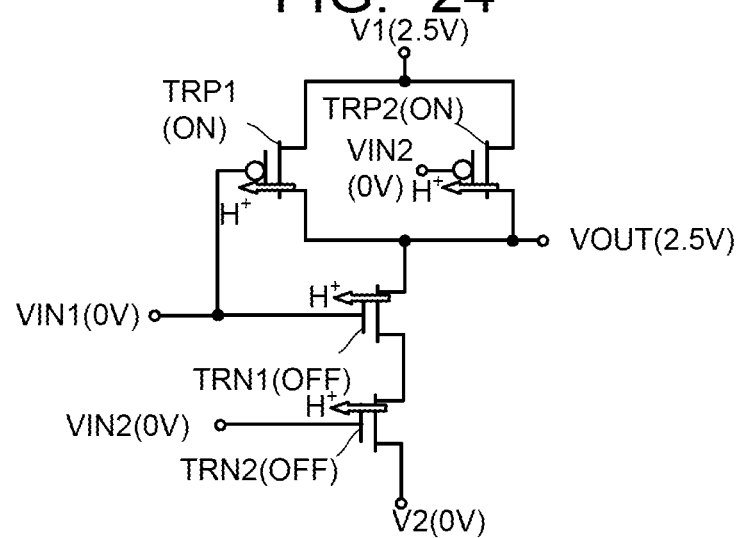
FIG. 24 is a schematic circuit diagram for explaining the operation in the period P1.

FIG. 24 is a schematic circuit diagram for explaining the operation in the period P1. In the period P1, the transistors TRP1 and TRP2 are turned into the on-state (ON), and the transistors TRN1 and TRN2 are turned into the off-state (OFF). In this event, the value of the potential VOUT changes from the value VH (1.5 V) to the value VB (2.5 V).

Further, in the period P1, a negative voltage is applied between the first gate and the first source of the transistor TRP1 so that the first gate is lower in potential than the first source of the transistor TRP1, a negative voltage is applied between the second gate and the second drain of the transistor TRN1 so that the second gate is lower in potential than the second drain of the transistor TRN1, a negative voltage is applied between the third gate and the third source of the transistor TRP2 so that the third gate is lower in potential than the third source of the transistor TRP2, and a negative voltage is applied between the fourth gate and the fourth drain of the transistor TRN2 so that the fourth gate is lower in potential than the fourth drain of the transistor TRN2. This can draw the protons or holes caused by the radiation ray incident on the device 10 to remove them via each of the first to fourth gates.

Next, in the period P2, as illustrated in FIG. 23, the value of the power supply voltage VDD to be supplied to the electronic circuit 1 changes from the value VB to a value VC at a time T2, and the values of the potentials VIN1, VIN2 are maintained at the value VL. An example of the value VC is lower than the value VA and equal to or lower than the ground potential, and is 0 V.

Figure 25:
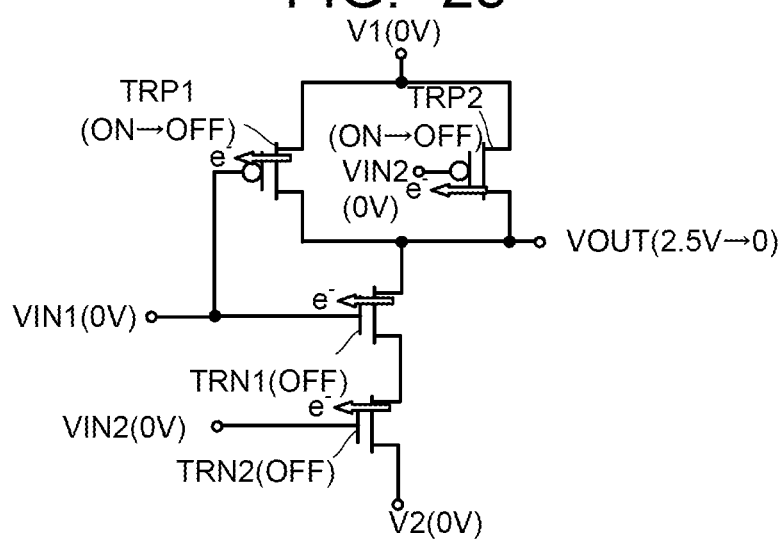
FIG. 25 is a schematic circuit diagram for explaining the operation in the period P2.

FIG. 25 is a schematic circuit diagram for explaining the operation in the period P2. In the period P2, the transistors TRP1 and TRP2 are in the on-state, and therefore the value of the potential VOUT transiently changes from the value VB (2.5 V) during which the transistors TRP1 and TRN2 are turned into the off-state, and is set to the value VL (0 V) at a time TX. Further, in the period P2, the transistors TRN1 and TRN2 are maintained in the off-state (OFF).

Further, in the period P2, a negative voltage is applied between the first gate and the first drain of the transistor TRP1 so that the first gate is lower in potential than the first drain of the transistor TRP1, a positive voltage is applied between the first drain and the first source of the transistor TRP1, a negative voltage is applied between the second gate and the second drain of the transistor TRN1 so that the second gate is lower in potential than the second drain of the transistor TRN1, a positive voltage is applied between the second drain and the second source of the transistor TRN1, a negative voltage is applied between the third gate and the third drain of the transistor TRP2 so that the third gate is lower in potential than the third drain of the transistor TRP2, a positive voltage is applied between the third drain and the third source of the transistor TRP2, a negative voltage is applied between the fourth gate and the fourth drain of the transistor TRN2 so that the fourth gate is lower in potential than the fourth drain of the transistor TRN2, and a positive voltage is applied between the fourth drain and the fourth source of the transistor TRN2. This can inject hot electrons into the gate insulating films of the transistors TRP1, TRP2, TRN1 and TRN2 via the channel regions. This can neutralize the protons or holes, which are caused by the radiation ray incident on the device 10, in the gate insulating films.

Next, in the period P3, as illustrated in FIG. 23, the value of the power supply voltage VDD to be supplied to the electronic circuit 1 changes from the value VC (0 V) to the value VB (2.5 V) at a time T3, and the values of the potentials VIN1, VIN2 are maintained at the value VL (0 V).

Figure 26:
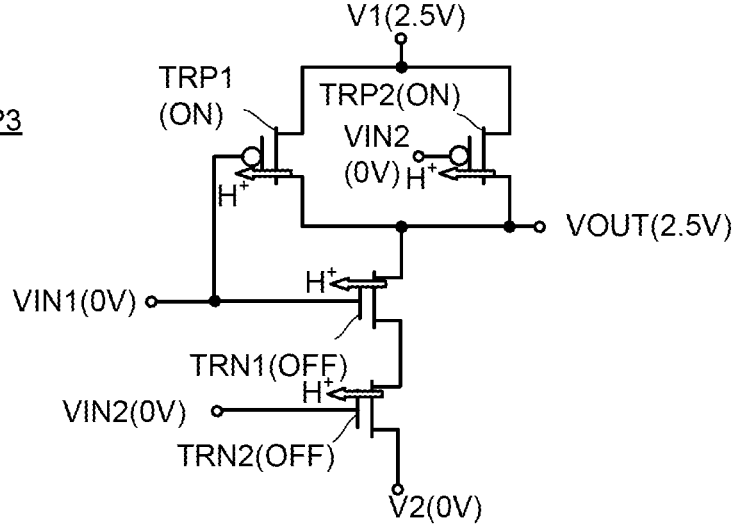
FIG. 26 is a schematic circuit diagram for explaining the operation in the period P3.

FIG. 26 is a schematic circuit diagram for explaining the operation in the period P3. In the period P3, the transistors TRP1 and TRP2 are turned into the on-state (ON), and the transistors TRN1 and TRN2 are turned into the off-state (OFF). In this event, the value of the potential VOUT changes from the value VL (0 V) to the value VB (2.5 V).

Further, in the period P3, a negative voltage is applied between the first gate and the first source of the transistor TRP1 so that the first gate is lower in potential than the first source of the transistor TRP1, a negative voltage is applied between the second gate and the second drain of the transistor TRN1 so that the second gate is lower in potential than the second drain of the transistor TRN1, a negative voltage is applied between the third gate and the third source of the transistor TRP2 so that the third gate is lower in potential than the third source of the transistor TRP2, and a negative voltage is applied between the fourth gate and the fourth drain of the transistor TRN2 so that the fourth gate is lower in potential than the fourth drain of the transistor TRN2. This can remove the protons or holes caused by the radiation ray incident on the device 10 via each of the first to fourth gates.

Thereafter, in the period PX, the device 10 operates in the normal operation mode again after a time T4. The above is the explanation of the first operation example.

Second Operation Example of the Third Configuration Example

Figure 27:
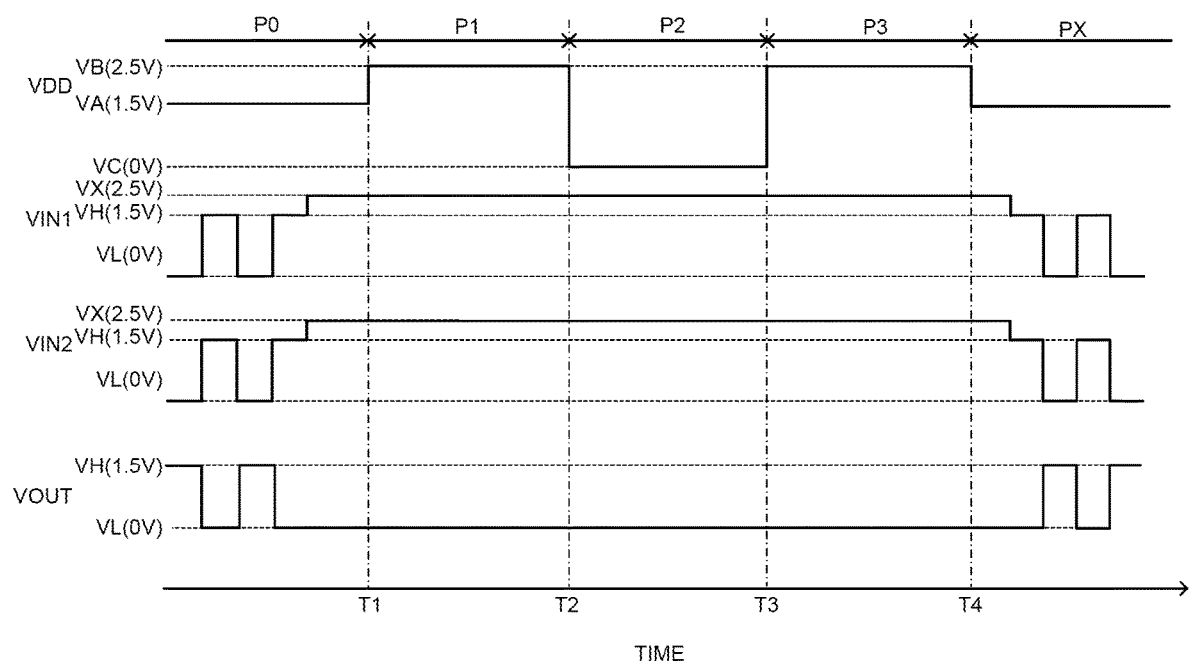
FIG. 27 is a timing chart for explaining a second operation example of a third configuration example of the electronic circuit 1.

FIG. 27 is a timing chart for explaining a second operation example of the third configuration example of the electronic circuit 1. The second operation example of the third configuration example is different in the values of the potentials VIN1, VIN2 in the periods P1 to P3 as compared with the first operation example of the third configuration example. A portion of the second operation example different from that in the first operation example will be explained below, and the explanation of the first operation example can be appropriately employed for the other portion.

In the periods P1 to P3, the device 10 operates in the refresh operation mode. In the period P1, as illustrated in FIG. 27, the values of the potentials VIN1, VIN2 are set to the value VX (2.5 V) before the time T1, and the value of the power supply voltage VDD to be supplied to the electronic circuit 1 changes from the value VA (1.5 V) to the value VB (2.5 V) at the time T1.

Figure 28:
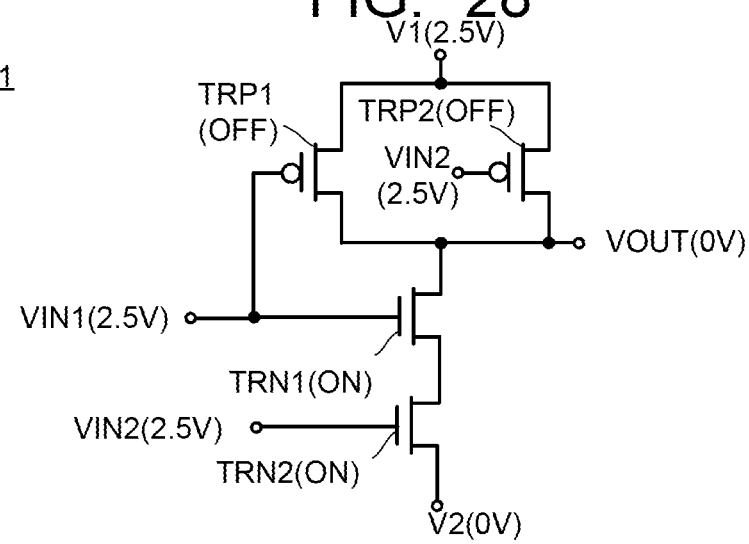
FIG. 28 is a schematic circuit diagram for explaining the operation in the period P1.

FIG. 28 is a schematic circuit diagram for explaining the operation in the period P1. In the period P1, the transistors TRP1 and TRP2 are turned into the off-state (OFF), and the transistors TRN1 and TRN2 are turned into the on-state (ON). In this event, the value of the potential VOUT is maintained at the value VL (0 V).

Next, in the period P2, as illustrated in FIG. 27, the value of the power supply voltage VDD to be supplied to the electronic circuit 1 changes from the value VB (2.5 V) to the value VC (0 V) at the time T2, and the values of the potential VIN1, VIN2 are maintained at the value VX (2.5 V).

Figure 29:
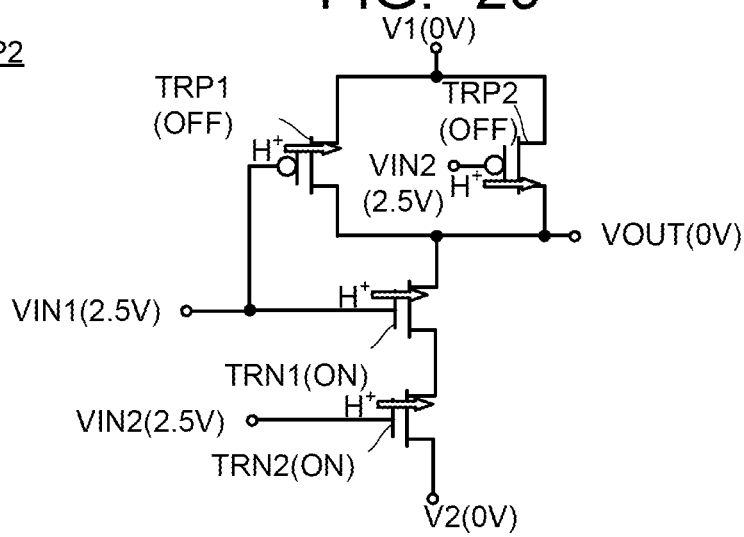
FIG. 29 is a schematic circuit diagram for explaining the operation in the period P2.

FIG. 29 is a schematic circuit diagram for explaining the operation in the period P2. In the period P2, the transistors TRN1 and TRN2 are maintained in the on-state, and therefore the value of the potential VOUT is maintained at the value VL (0 V). Further, in the period P2, the transistors TRP1 and TRP2 are maintained in the off-state (OFF).

Further, in the period P2, a positive voltage is applied between the first gate and the first source of the transistor TRP1 so that the first gate is higher in potential than the first source of the transistor TRP1, a positive voltage is applied between the second gate and the second source of the transistor TRN1 so that the second gate is higher in potential than the second source of the transistor TRN1, a positive voltage is applied between the third gate and the third source of the transistor TRP2 so that the third gate is higher in potential than the third source of the transistor TRP2, and a positive voltage is applied between the fourth gate and the fourth source of the transistor TRN2 so that the fourth gate is higher in potential than the fourth source of the transistor TRN2. This can draw the protons or holes caused by the radiation ray incident on the device 10 to remove them via each of the gate insulating films of the transistors TRP1, TRN1, TRP2 and TRN2.

Next, in the period P3, as illustrated in FIG. 27, the value of the power supply voltage VDD to be supplied to the electronic circuit 1 changes from the value VC (0 V) to the value VB (2.5 V) at the time T3, and the values of the potentials VIN1, VIN2 are maintained at the value VX (2.5 V).

Figure 30:
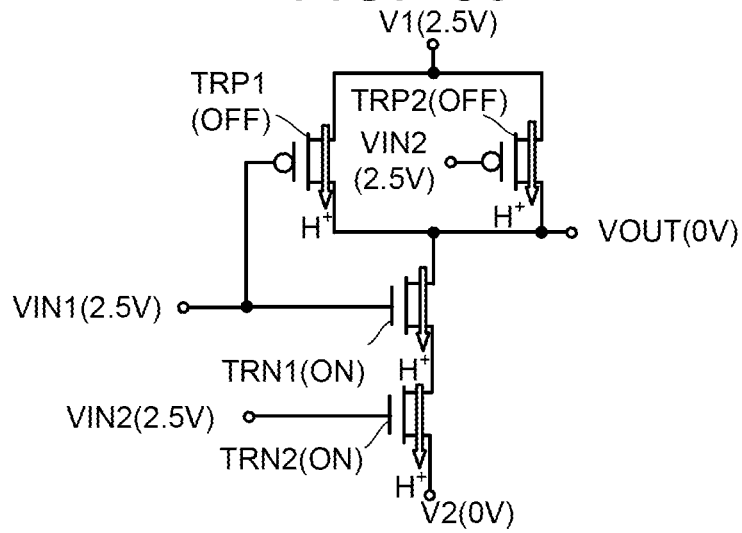
FIG. 30 is a schematic circuit diagram for explaining the operation in the period P3.

FIG. 30 is a schematic circuit diagram for explaining the operation in the period P3. In the period P3, the transistors TRN1 and TRN2 are maintained in the on-state, and therefore the value of the potential VOUT is maintained at the value VL (0 V). Further, in the period P3, the transistors TRP1 and TRP2 are maintained in the off-state (OFF).

Further, in the period P3, a positive voltage is applied between the first drain and the first source of the transistor TRP1, a positive voltage is applied between the second gate and the second source of the transistor TRN1 so that the second gate is higher in potential than the second source of the transistor TRN1, a positive voltage is applied between the third drain and the third source of the transistor TRP2, and a positive voltage is applied between the fourth gate and the fourth source of the transistor TRN2 so that the fourth gate is higher in potential than the fourth source of the transistor TRN2. This can move the protons or holes caused by the radiation ray incident on the device 10 in the channel regions of the transistors TRP1, TRN1, TRP2 and TRN2 to remove them. The protons or holes are drawn to the channel regions via the gate insulating films in the transistors TRN1 and TRN2.

Thereafter, in the period PX, the device 10 operates in the normal operation mode again after the time T4. The above is the explanation of the second operation example.

In the first to third configuration examples, the refresh operation in the periods P1 to P3 may be repeated every predetermined time. A predetermined time $t_R$ in this event can be estimated by approximation by a time during which the protons cross a space between the drain and the source, and is preferably set to a value which is calculated, for example, by the following Expression (1). $L_g$ denotes the gate length of an object transistor. $v_{\{H++\}}$ denotes the speed of the protons in the gate insulating film of the object transistor. $\mu$ denotes the mobility ($1.14 \times 10^{-11}$ cm$^2$/Vs) of the protons in the gate insulating film of the object transistor. Vd denotes the drain voltage of the object transistor.

$$t_R = \frac{L_g}{v_{(H+)}} = \frac{L_g^2}{\mu V_d} \qquad (1)$$

Further, a length $t_{RG}$ of each of the periods of the periods P1 to P3 can be estimated by approximation by the longest time during which the protons cross the gate insulating film, and is preferably set to a value which can be calculated, for example, by the following Expression (2). $T_{OX}$ denotes the thickness of the gate insulating film of the object transistor. $V_{Rg}$ denotes the gate voltage of the object transistor in each period.

$$t_{RG} = \frac{T_{ox}}{v_{(H+)}} = \frac{T_{ox}^2}{\mu V_{Rg}} \tag{2}$$

For example, when $L_g$=1 μm, $T_{OX}$=10 nm, Vd=1 V, $V_{Rg}$=10 V, $t_R$ is about 877.19 seconds and $t_{RG}$ is about $8.77 \times 10^{-3}$ seconds.

As explained above, the device in this embodiment performs the refresh operation of the transistor and thereby can improve the shift of the threshold voltage and the decrease in the ON current of the transistor. This can prevent the operation failure of the device. The refresh operation mode only needs to include at least one of the first to third refresh operations.

Second Embodiment

Figure 31:
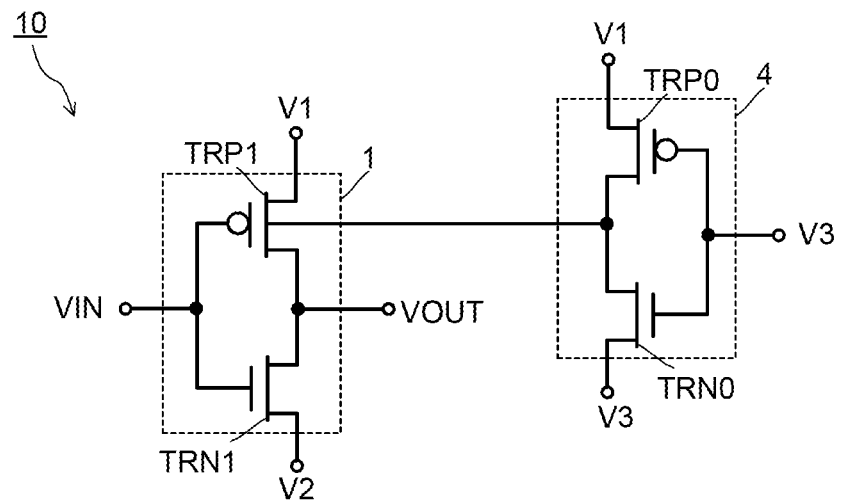
FIG. 31 is a schematic circuit diagram illustrating another configuration example of a semiconductor device.
Figure 32:
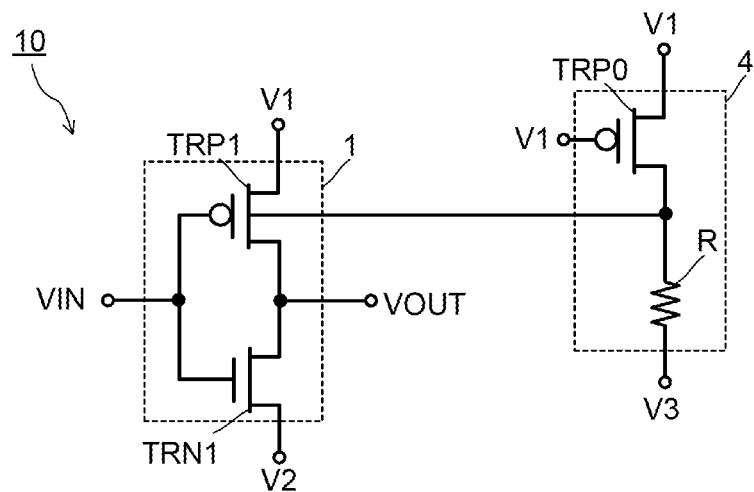
FIG. 32 is a schematic circuit diagram illustrating the other configuration example of the device.
Figure 33:
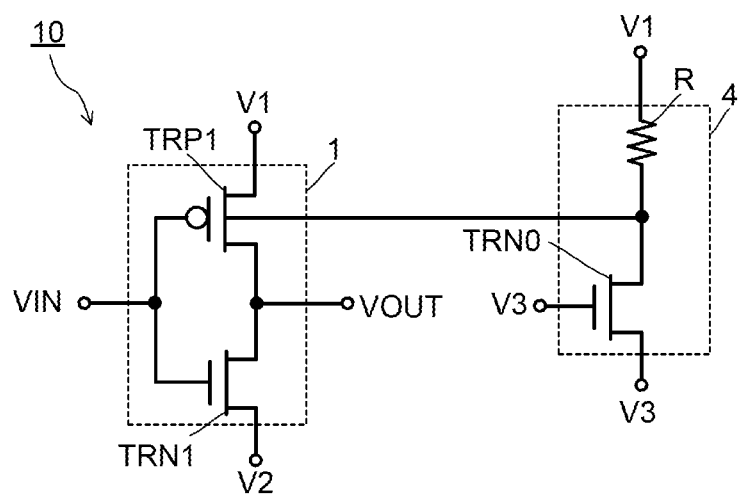
FIG. 33 is a schematic circuit diagram illustrating the other configuration example of the device.

FIG. 31 to FIG. 33 are schematic circuit diagrams illustrating another configuration example of a semiconductor device. A semiconductor device 10 includes an electronic circuit 1 and a back gate control circuit 4.

The electronic circuit 1 is a controlled object circuit. The electronic circuit 1 has a function of receiving a signal IN and transmits a signal OUT. Examples of the electronic circuit 1 has a NOT gate (also referred to as a NOT circuit, an inverter circuit), a NOR gate (also referred to as a NOR circuit), or a NAND gate (also referred to as a NAND circuit). The electronic circuit 1 may include, but not limited to these logic gates, another logic gate. In the second embodiment, an example in which the electronic circuit 1 has a NOT gate will be explained as an example.

The electronic circuit 1 has a transistor TRP1 and a transistor TRN1. The transistor TRP1 is a P-channel type field-effect transistor. The transistor TRN1 is an N-channel type field-effect transistor. The transistors TRP1 and TRN1 form a NOT gate. The explanation of the first operation example can be appropriately employed for the structures of the transistors.

The transistor TRP1 has a first gate, a back gate, a first source, and a first drain. The first gate has a potential VIN changing in response to a signal IN. One of the first source and the first drain has a potential V1 changing in response to the power supply voltage VDD. Note that in the second embodiment, the power supply voltage VDD may be a constant voltage. In the case of the constant voltage, the power supply circuit 2 only needs to be able to output the constant voltage, and therefore no correction circuit 3 is necessary.

The transistor TRN1 has a second gate, a second source, and a second drain. The second gate is electrically connected to the first gate. One of the second source and the second drain has a potential V2 being equal to or lower than the ground potential.

The other of the second source and the second drain is electrically connected to the other of the first source and the first drain and has a potential VOUT.

First Configuration Example of the Back Gate Control Circuit 4

The back gate control circuit 4 illustrated in FIG. 31 has a transistor TRP0 and a transistor TRN0. The transistor TRP0 is a P-channel type field-effect transistor. The transistor TRN0 is an N-channel type field-effect transistor. The explanation of the first embodiment can be appropriately employed for the structures of the transistors.

The transistor TRP0 has a fifth gate, a fifth source, and a fifth drain. The fifth gate has a potential V3. One of the fifth source and the fifth drain has a potential V1. An example of the potential V3 is higher than the ground potential, and is preferably set in a range from the power supply voltage VDD to a difference between VDD and Vsubmax (VDD–Vsubmax) as needed. Here, Vsubmax corresponds to the potential at which the diode formed by an n-type well region and a source side impurity region of the P-channel type field-effect transistor is turned into the on-state.

The transistor TRN0 has a sixth gate, a sixth source, and a sixth drain. The sixth gate is electrically connected to the fifth gate. One of the sixth source and the sixth drain has the potential V2. The other of the sixth source and the sixth drain is electrically connected to the other of the fifth source and the fifth drain and is electrically connected to the back gate of the transistor TRP1.

Next, an operation example of the back gate control circuit 4 will be explained. When a radiation ray is incident on the device 10, the transistor TRP1 deteriorates as explained above to shift the threshold voltage.

In this event, the transistors TRP0 and TRN0 also similarly deteriorate to shift the threshold voltage, so that the potential of the back gate of the transistor TRP1 also changes. For example, when the threshold voltage of the transistor TRP1 shifts to the negative, the potential of the back gate rises. When the threshold voltage of the transistor TRP1 shifts to the positive, the potential of the back gate lowers. This can cancel the shift of the threshold voltage of the transistor TRP1. This can prevent the operation failure of the device 10.

Second Configuration Example of the Back Gate Control Circuit 4

The back gate control circuit 4 illustrated in FIG. 32 has a transistor TRP0 and a resistance element R. The transistor TRP0 is a P-channel type field-effect transistor. The explanation of the first embodiment can be appropriately employed for the structures of the transistors.

The transistor TRP0 has a fifth gate, a fifth source, and a fifth drain. The fifth gate has a potential V1. One of the fifth source and the fifth drain has the potential V1.

The resistance element R has a first terminal and a second terminal. The first terminal has a potential V3. The second terminal is electrically connected to the other of the fifth source and the fifth drain, and is electrically connected to the back gate of the transistor TRP1. The use of the resistance element in place of the transistor TRN0 facilitates the setting of the logical amplitude.

Next, an operation example of the back gate control circuit 4 will be explained. When a radiation ray is incident on the device 10, the transistor TRP1 deteriorates as explained above to shift the threshold voltage.

In this event, the transistor TRP0 also similarly deteriorates to shift the threshold voltage, so that the potential of the back gate of the transistor TRP1 also changes. For example, when the threshold voltage of the transistor TRP1 shifts to the negative, the potential of the back gate rises. When the threshold voltage of the transistor TRP1 shifts to the positive, the potential of the back gate lowers. This can cancel the shift of the threshold voltage of the transistor TRP1. This can prevent the operation failure of the device 10.

Third Configuration Example of the Back Gate Control Circuit 4

The back gate control circuit 4 illustrated in FIG. 33 has a transistor TRN0 and a resistance element R. The transistor TRN0 is an N-channel type field-effect transistor. The explanation of the first embodiment can be appropriately employed for the structures of the transistors.

The transistor TRP0 has a sixth gate, a sixth source, and a sixth drain. The sixth gate has a potential V3. One of the sixth source and the sixth drain has the potential V3.

The resistance element R has a first terminal and a second terminal. The first terminal has a potential V1. The second terminal is electrically connected to the other of the sixth source and the sixth drain, and is electrically connected to the back gate of the transistor TRP1. The use of the resistance element in place of the transistor TRP0 facilitates the setting of the logical amplitude.

Next, an operation example of the back gate control circuit 4 will be explained. When a radiation ray is incident on the device 10, the transistor TRP1 deteriorates as explained above to shift the threshold voltage.

In this event, the transistor TRP0 also similarly deteriorates to shift the threshold voltage, so that the potential of the back gate of the transistor TRP1 also changes. For example, when the threshold voltage of the transistor TRP1 shifts to the negative, the potential of the back gate rises. When the threshold voltage of the transistor TRP1 shifts to the positive, the potential of the back gate lowers. This can cancel the shift of the threshold voltage of the transistor TRP1. This can prevent the operation failure of the device 10.

This embodiment can be combined with the other embodiments as needed. The back gate control circuit 4 is not limited to the configuration of being electrically connected to the back gate of the transistor TRP1, but may be electrically connected to the back gate of the other field-effect transistor in the electronic circuit 1. For example, the back gate control circuit 4 may be electrically connected to the back gate of any one of the transistors TRP1, TRN1, TRP2 and TRN2 in the first embodiment. Further, the device 10 may include a plurality of back gate control circuits 4, and the back gate control circuits 4 may be electrically connected to the back gates of the different field-effect transistors, respectively.

While certain embodiments have been described, these embodiments have been presented by way of example only, and are not intended to limit the scope of the inventions. Indeed, those novel embodiments may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   an electronic circuit configured to receive a first signal and transmit a second signal;
   a power supply circuit configured to supply a power supply voltage to the electronic circuit; and
   a correction circuit configured to control the power supply circuit to change a value of the power supply voltage to switch between a normal operation mode and a refresh operation mode of the device, wherein:
   the electronic circuit comprises:
      a first P-channel type field-effect transistor having a first gate, a first source, and a first drain, a potential of the first gate changing in response to the first signal, and a potential of one of the first source and the first drain changing in response to the power supply voltage; and
      a first N-channel type field-effect transistor having a second gate, a second source, and a second drain, the second gate being electrically connected to the first gate, a potential of one of the second source and the second drain being equal to or lower than a ground potential, and another of the second source and the second drain being electrically connected to another of the first source and the first drain; and
   the refresh operation mode comprises at least one operation selected from the group consisting of:
      a first operation of applying a negative voltage between the first gate and at least one selected from the group consisting of the first source and the first drain so that the first gate is lower in potential than the at least one selected from the group consisting of the first source and the first drain, and applying a negative voltage between the second gate and at least one selected from the group consisting of the second source and the second drain so that the second gate is lower in potential than the at least one selected from the group consisting of the second source and the second drain;
      a second operation of applying a positive voltage between the first gate and at least one selected from the group consisting of the first source and the first drain so that the first gate is higher in potential than the at least one selected from the group consisting of the first source and the first drain, and applying a positive voltage between the second gate and at least one selected from the group consisting of the second source and the second drain so that the second gate is higher in potential than the at least one selected from the group consisting of the second source and the second drain; and
      a third operation of applying a voltage between the first drain and the first source, and applying a voltage between the second drain and the second source.

2. The device according to claim 1, wherein:
   the electronic circuit comprises a NOT gate, a NOR gate, or a NAND gate; and
   the NOT gate, the NOR gate, or the NAND gate has the first P-channel type field-effect transistor and the first N-channel type field-effect transistor.

3. The device according to claim 2, wherein
   the first operation includes applying the negative voltage to remove protons or holes via each of the first gate and the second gate, the protons or holes being caused by a radiation ray incident on the device.

4. The device according to claim 2, wherein
   the second operation includes applying the positive voltage to remove protons or holes via each of a channel region of the first P-channel type field-effect transistor and a channel region of the first N-channel type field-effect transistor, the protons or holes being caused by a radiation ray incident on the device.

5. The device according to claim 2, wherein
the third operation includes injecting hot electrons into the first P-channel type field-effect transistor via a channel region thereof and injecting hot electrons into a gate insulator of the first N-channel type field-effect transistor via a channel region thereof, to neutralize protons or holes caused by a radiation ray incident on the device.

6. The device according to claim 2, wherein:
the first P-channel type field-effect transistor further has a first back gate;
the first back gate is connected to a back gate control circuit;
the back gate control circuit comprises at least one field-effect transistor selected from the group consisting of a P-channel type field-effect transistor and an N-channel type field-effect transistor; and
a potential of the first back gate changes in response to a threshold voltage of the at least one field-effect transistor shifting due to a radiation ray incident on the device.

7. The device according to claim 1, wherein
the first operation includes applying the negative voltage to remove protons or holes via each of the first gate and the second gate, the protons or holes being caused by a radiation ray incident on the device.

8. The device according to claim 1, wherein
the second operation includes applying the positive voltage to remove protons or holes via each of a channel region of the first P-channel type field-effect transistor and a channel region of the first N-channel type field-effect transistor, the protons or holes being caused by a radiation ray incident on the device.

9. The device according to claim 1, wherein
the third operation includes injecting hot electrons into the first P-channel type field-effect transistor via a channel region thereof and injecting hot electrons into a gate insulator of the first N-channel type field-effect transistor via a channel region thereof, to neutralize protons or holes caused by a radiation ray incident on the device.

10. The device according to claim 1, wherein:
the first P-channel type field-effect transistor further has a first back gate;
the first back gate is connected to a back gate control circuit;
the back gate control circuit comprises at least one field-effect transistor selected from the group consisting of a P-channel type field-effect transistor and an N-channel type field-effect transistor; and
a potential of the first back gate changes in response to a threshold voltage of the at least one field-effect transistor shifting due to a radiation ray incident on the device.

* * * * *